(12) United States Patent
Ogawa et al.

(10) Patent No.: US 9,177,657 B2
(45) Date of Patent: Nov. 3, 2015

(54) SEMICONDUCTOR DEVICE HAVING NON-VOLATILE MEMORY WITH DATA ERASE SCHEME

(75) Inventors: Tomoya Ogawa, Kawasaki (JP); Takashi Ito, Kawasaki (JP); Mitsuhiro Tomoeda, Yokohama (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/400,500

(22) PCT Filed: Aug. 29, 2012

(86) PCT No.: PCT/JP2012/071822
§ 371 (c)(1),
(2), (4) Date: Nov. 11, 2014

(87) PCT Pub. No.: WO2014/033851
PCT Pub. Date: Mar. 6, 2014

(65) Prior Publication Data
US 2015/0131384 A1      May 14, 2015

(51) Int. Cl.
*G11C 16/04*   (2006.01)
*G11C 16/14*   (2006.01)
*G11C 16/06*   (2006.01)
*G11C 16/32*   (2006.01)

(52) U.S. Cl.
CPC .............. *G11C 16/14* (2013.01); *G11C 16/06* (2013.01); *G11C 16/32* (2013.01)

(58) Field of Classification Search
CPC ........ G11C 16/16; G11C 16/14; G11C 16/10; G11C 16/30
USPC ....................................... 365/185.29, 185.18
See application file for complete search history.

(56) References Cited

U.S. PATENT DOCUMENTS

| 7,636,265 | B2 | 12/2009 | Park et al. | |
| 7,773,414 | B2* | 8/2010 | Hemink | 365/185.02 |
| 7,974,128 | B2 | 7/2011 | Park et al. | |
| 2002/0101764 | A1* | 8/2002 | Tani et al. | 365/185.29 |
| 2003/0161191 | A1* | 8/2003 | Matsuda et al. | 365/189.11 |
| 2006/0279994 | A1 | 12/2006 | Park et al. | |

(Continued)

FOREIGN PATENT DOCUMENTS

| JP | 11-260073 A | 9/1999 |
| JP | 2001-035173 A | 2/2001 |

(Continued)

OTHER PUBLICATIONS

International Search Report issued in PCT/JP2012/071822, dated Nov. 21, 2012, with English translation.

*Primary Examiner* — Huan Hoang
(74) *Attorney, Agent, or Firm* — McDermott Will & Emery LLP

(57) ABSTRACT

In a nonvolatile memory device (4) provided in a semiconductor device, when data is erased based on a band-to-band tunneling scheme, supply of a boosted voltage to a memory cell (MC) to be erased is ended when a condition that an output voltage (VUCP) of a charge pump circuit (52) has recovered to a predetermined reference voltage is satisfied and additionally a condition that a predetermined reference time has elapsed since start of supply of the boosted voltage (VUCP) to the memory cell (MC) to be erased is satisfied.

10 Claims, 23 Drawing Sheets

(56) References Cited

U.S. PATENT DOCUMENTS

2008/0266983 A1    10/2008    Kim et al.
2010/0067303 A1    3/2010    Park et al.

FOREIGN PATENT DOCUMENTS

| | | |
|---|---|---|
| JP | 2006-351166 A | 12/2006 |
| JP | 2008-276925 A | 11/2008 |

* cited by examiner

SEMICONDUCTOR DEVICE HAVING NON-VOLATILE MEMORY WITH DATA ERASE SCHEME

RELATED APPLICATIONS

This application is the U.S. National Phase under 35 U.S.C. §371 of International Application No. PCT/JP2012/071822, filed on Aug. 29, 2012, the disclosure of which Application is incorporated by reference herein.

TECHNICAL FIELD

The present invention relates to a semiconductor device including an electrically rewritable nonvolatile memory device, and is suitably used, for example, for a nonvolatile memory device of the type in which data is erased by band-to-band tunneling current.

BACKGROUND ART

Regarding a semiconductor device including an electrically rewritable nonvolatile memory device such as flash memory, the time taken for programming (writing) tends to increase with an increase of the capacity of the nonvolatile memory device.

Japanese Patent Laying-Open No. 2006-351166 (PTD 1) discloses a technique for shorting this time taken for programming. Specifically, a flash memory device of this document includes a control logic, a high-voltage generator circuit, and a signal generator circuit. The control logic generates, during a program interval, a first flag signal for indicating that a program voltage is supplied to a word line. The high-voltage generator circuit generates the program voltage supplied to the word line, and generates, during the program interval, a second flag signal for indicating that the program voltage has been recovered to a target voltage. The signal generator circuit generates a program execution end signal in response to the first and second flag signals. When the program execution end signal is generated, the control logic deactivates the first flag signal so that the program interval is terminated.

CITATION LIST

Patent Document

PTD 1: Japanese Patent Laying-Open No. 2006-351166

SUMMARY OF INVENTION

Technical Problem

In the case where current flowing in a memory cell during erasure (erase current) is relatively large like the current of the erase scheme utilizing band-to-band tunneling, the number of memory cells that can be erased simultaneously is limited depending on the current supply ability of a charge pump circuit. Accordingly, a memory array is usually divided into a plurality of blocks, and a high voltage is applied to a common source line block by block during erasure.

The magnitude of the erase current varies due to variations of memory cells, erase blocks, semiconductor devices, manufacture processes, and the like. If the magnitude of the erase current and the time which is set for execution of erasure are optimized in consideration of these variations (so that the magnitude of the erase current and the erase time have margins), there arises a problem that the erase time increases or the erase time is difficult to shorten.

Other problems and new characteristics will become clear from the description herein and the attached drawings.

Solution to Problem

In a semiconductor device according to one embodiment, when data is erased based on a band-to-band tunneling scheme, supply of a boosted voltage to a memory cell to be erased is ended when a condition that an output voltage of a charge pump circuit has recovered to a predetermined reference voltage is satisfied and additionally a condition that a predetermined reference time has elapsed since start of supply of the boosted voltage to the memory cell to be erased is satisfied.

Advantageous Effects of Invention

In accordance with the above-described embodiment, the time for which a pulse voltage is applied to the source of each memory cell can be optimized as compared with the conventional one, and thereby the erase time can be shortened.

DESCRIPTION OF EMBODIMENTS

Figure 1:
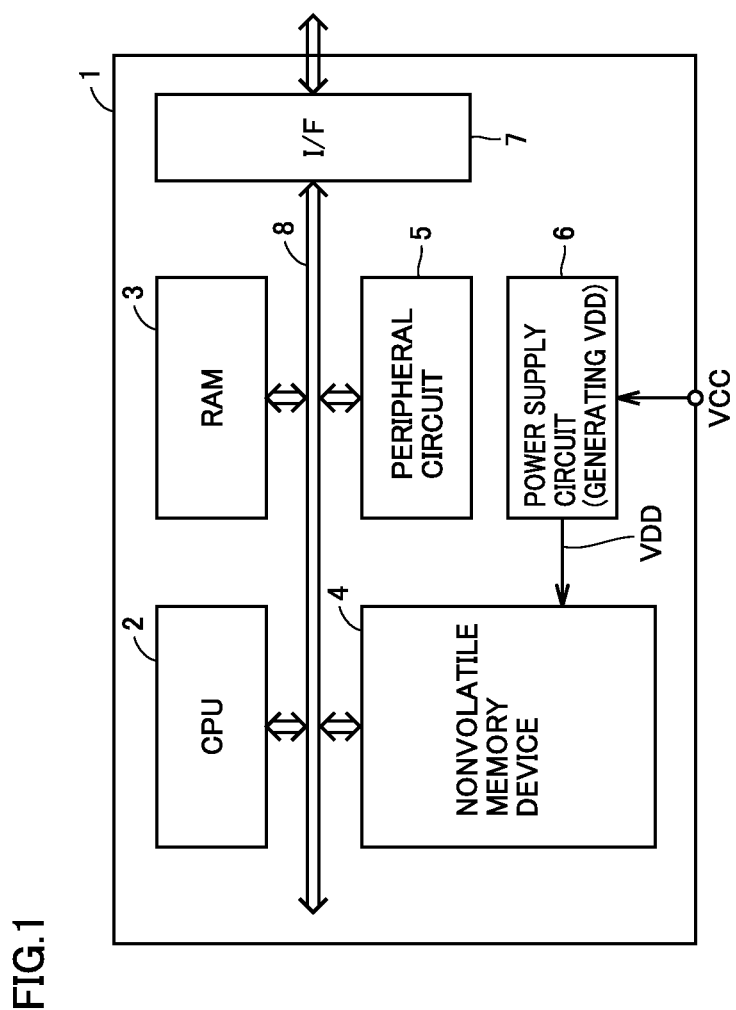
FIG. 1 is a block diagram showing a configuration of a semiconductor device according to a first embodiment.

In the following, each embodiment will be described in detail with reference to the drawings. The same or corresponding elements are denoted by the same reference characters, and a description thereof will not be repeated.

First Embodiment

[Configuration of Semiconductor Device]

FIG. 1 is a block diagram showing a configuration of a semiconductor device according to a first embodiment. In FIG. 1, a microcomputer chip 1 is shown as an example of the semiconductor device. Microcomputer chip 1 includes a CPU (Central Processing Unit) 2, a RAM (Random Access Memory) 3, a nonvolatile memory device 4, a peripheral circuit 5, an interface circuit 7, a data bus 8 connecting these elements to each other, and a power supply circuit 6.

Power supply circuit 6 generates an internal power supply voltage VDD based on an external power supply voltage received from the outside of microcomputer chip 1. Internal power supply voltage VDD is supplied to each element in microcomputer chip 1 (in FIG. 1, only the supply of VDD to nonvolatile memory device 4 is exemplarily shown).

Nonvolatile memory device 4 is a semiconductor memory device such as EEPROM (Electrically Erasable and Programmable Read-only Memory), flash memory, or the like. Each memory cell in these semiconductor memory devices has a charge storage portion between a gate electrode and a channel layer. Depending on charge stored in the charge storage portion, the threshold voltage of the memory cell varies and thus information "1" or "0" can be stored. As the charge storage portion, a floating gate formed of a polycrystalline silicon film, a silicon nitride film, or the like is commonly used. The silicon nitride film stores charge at trap levels dispersed in the film. In connection with the present embodiment, an example where a silicon nitride film is used as the charge storage portion will be described. The following is a more detailed description regarding a specific configuration of a memory cell.

[Configuration of Memory Cell]

Figure 2A:
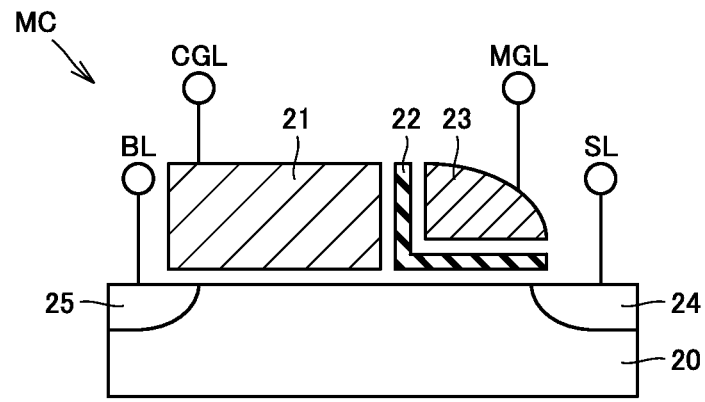
FIG. 2A is a cross-sectional view schematically showing a configuration of a memory cell.
Figure 2B:
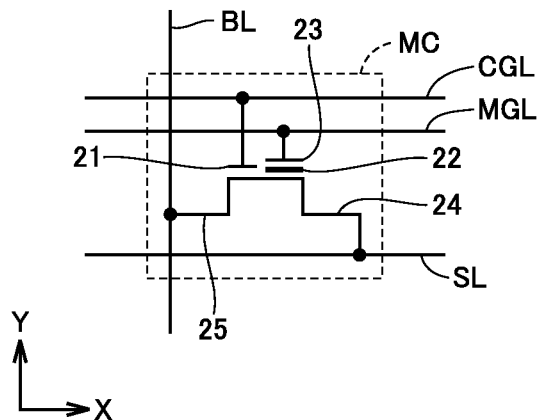
FIG. 2B is a diagram showing schematic symbols of the memory cell.

FIG. 2A is a cross-sectional view schematically showing a configuration of a memory cell. FIG. 2B is a diagram showing schematic symbols of the memory cell. In FIGS. 2A and 2B, elements corresponding to each other are denoted by the same reference characters.

Referring to FIGS. 2A and 2B, a memory cell (also referred to as "memory cell transistor") MC is formed on a substrate 20, and includes a control gate (CG) 21, a silicon nitride film 22, a memory gate (MG) 23, a source region 24, and a drain region 25. Control gate 21 is formed on a surface of P-type silicon substrate 20 with an insulating layer (not shown) interposed therebetween. On a sidewall of control gate 21, silicon nitride film 22 is formed in the form of an ONO (Oxide-Nitride-Oxide) film made up of a silicon oxide film (not shown), silicon nitride film 22, and a silicon oxide film (not shown). On the ONO film, memory gate 23 having a sidewall structure is formed. Source region 24 and drain region 25 are formed respectively through implantation of N-type impurities into respective portions of substrate 20 that are located on opposite sides of gates 21, 23. As seen in the direction perpendicular to substrate 20, a part of memory gate 23 and a part of source region 24 overlap each other, and a part of control gate 21 and a part of drain region 25 overlap each other.

In a memory array where a plurality of memory cells MC are arranged, there are provided a memory gate line MGL, a control gate line CGL, and a source line SL each corresponding to a memory cell row and extending in a row direction X. A bit line BL corresponding to a memory cell column and extending in a column direction Y is provided. In each memory cell MC, memory gate 23 is connected to a corresponding memory gate line MGL. Control gate 21 is connected to a corresponding control gate line CGL. Source region 24 is connected to a corresponding source line SL. Drain region 25 is connected to a corresponding bit line BL.

[Operation of Memory Cell]

To each memory cell MC, a unique address is assigned. Each memory cell MC stores 1-bit data based on a change of a threshold voltage depending on an amount of charge in the charge storage portion (silicon nitride film 22).

Figure 3A:
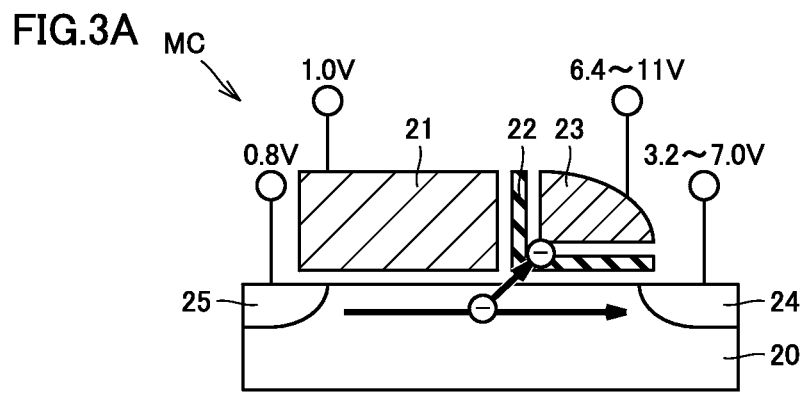
FIG. 3A is a diagram showing a state in a program pulse apply operation.
Figure 3B:
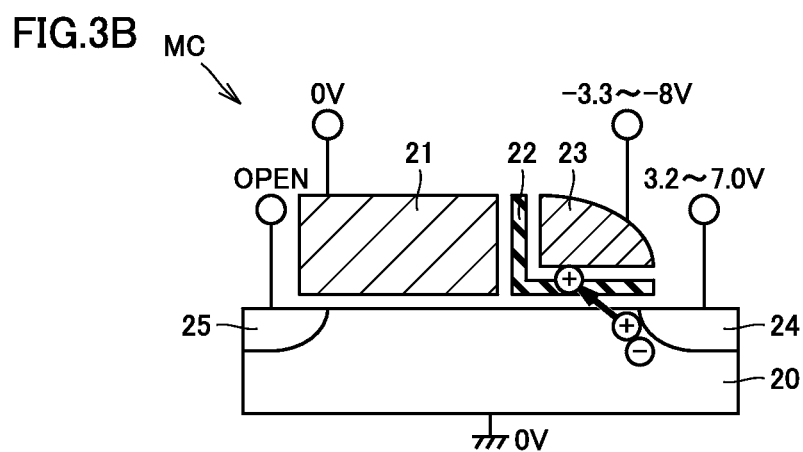
FIG. 3B is a diagram showing a state in an erase pulse apply operation.
Figure 3C:
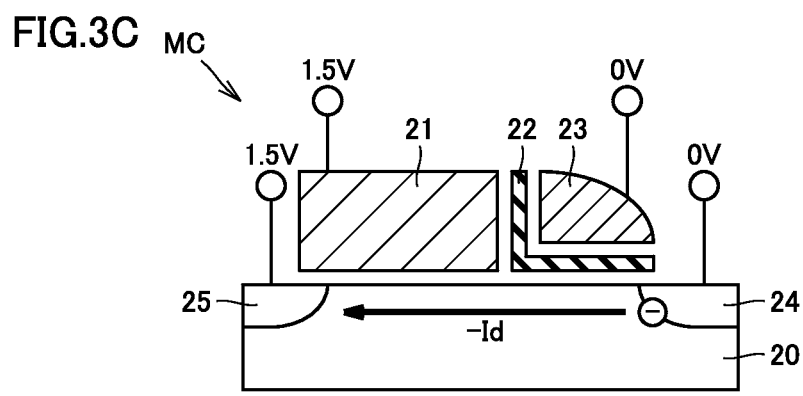
FIG. 3C is a diagram showing a state in a read operation.
Figure 3D:
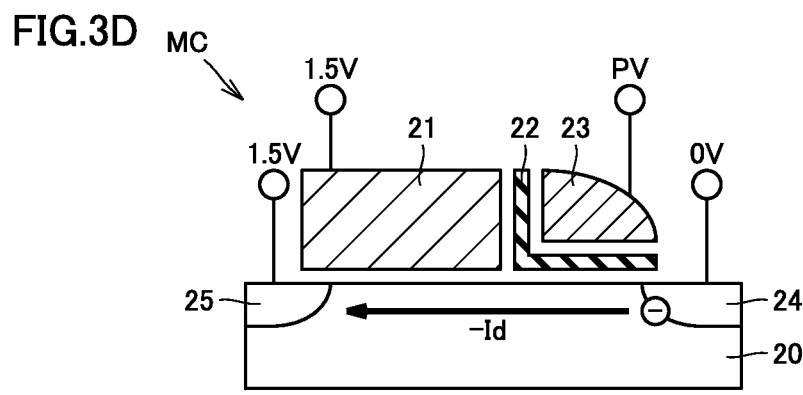
FIG. 3D is a diagram showing a state in a program verify operation.

FIGS. 3A to 3D each show a state in an operation of memory cell MC. FIG. 3A is a diagram showing a state in a program pulse apply operation, FIG. 3B is a diagram showing a state in an erase pulse apply operation, FIG. 3C is a diagram showing a state in a read operation, and FIG. 3D is a diagram showing a state in a program verify operation.

Referring to FIG. 3A, in the program pulse apply operation, a voltage selected from 6.4 to 11 V is applied to memory gate 23, 1.0 V is applied to control gate 21, a voltage selected from 3.2 to 7.0 V is applied to source region 24, and 0.8 V is applied to drain region 25. Thus, based on a source side injection (SSI) scheme, hot electrons are injected into silicon nitride film 22 to cause the threshold voltage of memory cell MC to increase. The program pulse apply operation is repeated until the threshold voltage of memory cell MC becomes higher than a predetermined program verify voltage PV. In the programmed memory cell MC, one of data "0" and "1", for example "1" is stored (although the stored data may be defined as "0", the stored data is herein defined as "1"). The voltage of memory gate 23 is set to a high positive level in the case where the threshold voltage of memory cell MC is difficult to increase. The voltage of source region 24 is set based on the voltage of memory gate 23.

Referring to FIG. 3B, in the erase pulse apply operation, a voltage selected from −3.3 to −8 V is applied to memory gate 23, 0 V is applied to control gate 21, 3.2 to 7.0 V is applied to source region 24, drain region 25 is caused to be an OPEN state, and substrate 20 is grounded (0 V is applied). Thus, a high electric field is applied to a portion of source region 24 that overlaps memory gate 23. The energy band is therefore bent to thereby cause band-to-band tunneling (BTBT) that allows electrons to tunnel from a valence band to a conduction band. The band-to-band tunneling causes holes to be generated in the valence band. The electrons having tunneled therethrough reach source line SL and a part of the holes generated in the valence band reaches substrate 20. Thus, current flows from source line SL to substrate 20. A part of the generated holes is accelerated in the high electric field to become hot holes which are injected into silicon nitride film 22. Accordingly, the threshold voltage of memory cell MC is decreased.

This erase pulse apply operation based on the band-to-band tunneling scheme is repeated until the threshold voltage of memory cell MC becomes lower than a predetermined erase verify voltage EV. In the erased memory cell MC, one of data "0" and "1", for example "0" is stored. The voltage of memory gate 23 is set to a high negative level in the case where the threshold voltage of memory cell MC is difficult to decrease. The voltage of source region 24 is set based on the voltage of memory gate 23.

Referring to FIG. 3C, in the read operation, 0 V is applied to memory gate 23 and source region 24, 1.5 V is applied to control gate 21 and drain region 25, and it is determined whether or not current Id flowing between drain region 25 and source region 24 is larger than a threshold current. In the case where current Id is larger than the threshold current, the threshold voltage of memory cell MC is lower and therefore it is determined that the data stored in memory cell MC is "0". On the contrary, in the case where current Id is smaller than the threshold current, the threshold voltage of memory cell MC is higher and therefore it is determined that the data stored in memory cell MC is "1".

Referring to FIG. 3D, in the program verify operation, a program verify voltage PV is applied to memory gate 23, 0 V is applied to source region 24, 1.5 V is applied to control gate 21 and drain region 25, and it is determined whether or not current Id flowing between drain region 25 and source region 24 is larger than the threshold current. In the case where current Id is larger than the threshold current, the threshold voltage of memory cell MC is lower than program verify voltage PV and therefore it is determined that programming has not been completed. On the contrary, in the case where current Id is smaller than the threshold current, the threshold voltage of memory cell MC is higher than program verify voltage PV and therefore it is determined that programming has been completed.

In an erase verify operation, an erase verify voltage EV is applied, instead of program verify voltage PV, to memory gate 23 in FIG. 3D. To the other elements, the same voltages as those shown in FIG. 3D are applied. In the case where current Id flowing between drain region 25 and source region 24 is larger than the threshold current, the threshold voltage of memory cell MC is lower than erase verify voltage EV and therefore it is determined that the erasure has been completed. On the contrary, in the case where current Id is smaller than the threshold current, the threshold voltage of memory cell MC is higher than erase verify voltage EV and therefore it is determined that the erasure has not been completed.

[Configuration of Nonvolatile Memory Device]

Figure 4:
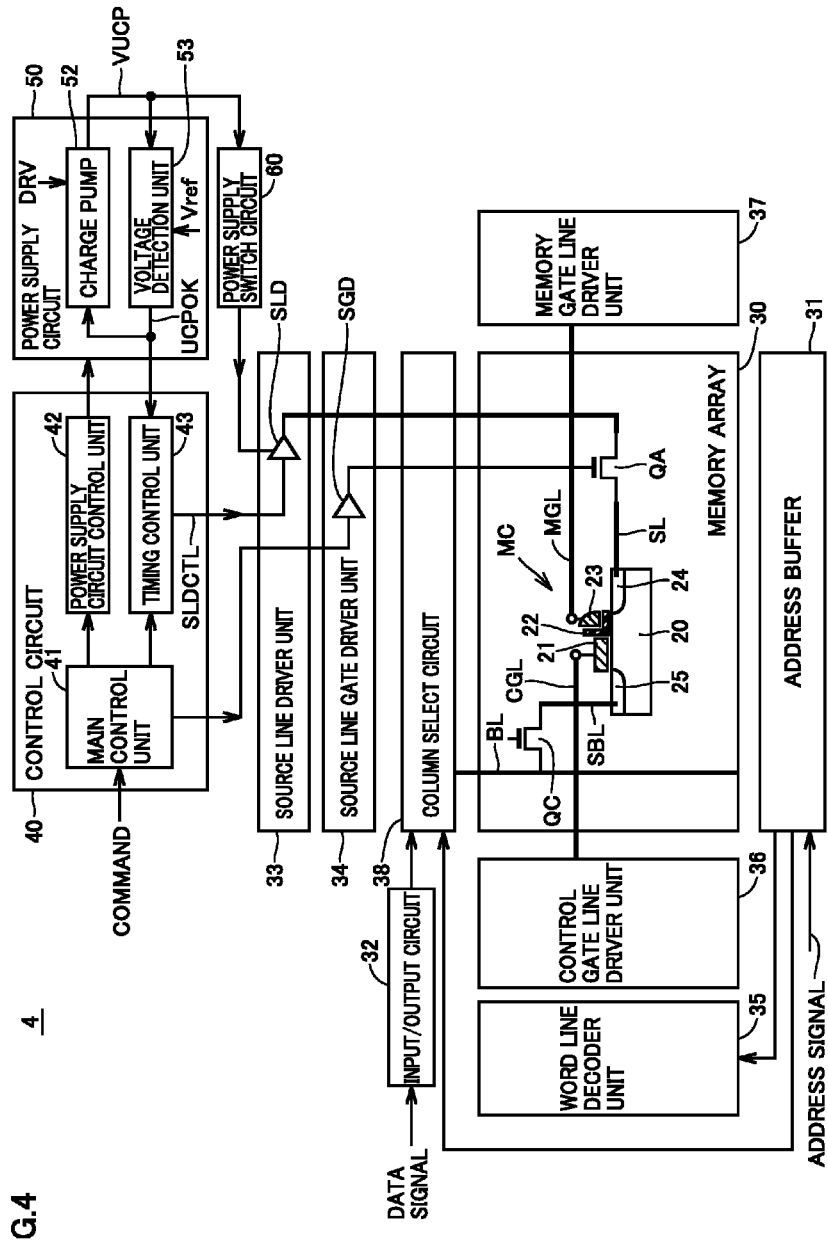
FIG. 4 is a block diagram showing an overall configuration of a nonvolatile memory device in FIG. 1.

FIG. 4 is a block diagram showing an overall configuration of the nonvolatile memory device in FIG. 1. Referring to FIG. 4, nonvolatile memory device 4 includes a memory array 30, an address buffer 31, an input/output circuit 32, a word line decoder unit 35, a control gate line driver unit 36, a memory gate line driver unit 37, a column select circuit 38, a source line driver unit 33, a source line gate driver unit 34, a power supply circuit 50, and a power supply switch circuit 60.

In memory array 30, a large number of memory cells MC descried in connection with to FIG. 2 are arranged in rows and columns. In the present embodiment, bit lines include a plurality of main bit lines BL and sub bit lines SBL. To each of main bit lines BL (corresponding to main bit lines BL0 to BL2047 in FIG. 5 and corresponding to main bit lines BL0 to BL255 in FIG. 6), a plurality of sub bit lines SBL (corresponding to sub bit lines BL0A, BL0B, . . . , BL255A, BL255B in FIG. 6) are connected through switching transistors QC (corresponding to transistors QC0A, QC0B, . . . , QC255A, QC255B in FIG. 6). Drain region 25 of memory cell MC is connected to a corresponding sub bit line SBL.

Address buffer 31 receives address signals (row address signal, column address signal) from the outside (CPU 2 in FIG. 1 for example) of nonvolatile memory device 4. Address buffer 31 outputs to word line decoder unit 35 the row address signal received from the outside, and outputs to column select circuit 38 the column address signal received from the outside.

Input/output circuit 32 outputs to column select circuit 38 a write data signal received from the outside (CPU 2 in FIG. 1 for example) of nonvolatile memory device 4. Further, input/output circuit 32 outputs to the outside of nonvolatile memory device 4 a read data signal received from column select circuit 38.

Word line decoder unit 35 decodes the row address signal received through address buffer 31 to thereby output a signal specifying a selected row of the memory array.

Control gate line driver unit 36 supplies a predetermined operating voltage, which is received through power supply switch circuit 60, to control gate line CGL corresponding to the selected row specified by word line decoder unit 35.

Memory gate line driver unit 37 supplies a predetermined operating voltage, which is received through power supply switch circuit 60, to memory gate line MGL corresponding to the selected row specified by word line decoder unit 35.

Source line driver unit 33 includes a plurality of source line drivers SLD. Each source line driver SLD supplies, to a corresponding source line SL, a ground voltage or a predetermined operating voltage which is received through power supply switch circuit 60. Each source line driver SLD is connected to source line SL (corresponding to SL0_0 to SL0_15 in FIG. 6) through a corresponding switching transistor QA (corresponding to QA0 to QA31 in FIG. 5).

Source line gate driver unit 34 includes a plurality of source line gate drivers SGD. Each source line gate driver unit 34 drives the gate of a corresponding transistor QA.

Column select circuit 38 is provided with a plurality of write latches corresponding to bit lines BL, respectively. Each write latch stores write data which is input through input/output circuit 32.

Column select circuit 38 is further provided with a column decoder circuit decoding a column address signal received thorough address buffer 31. When data is written, column select circuit 38 supplies a ground voltage or a predetermined operating voltage, which is received through power supply switch circuit 60, to a selected bit line BL (bit line BL corresponding to a selected column), based on the result of decoding by the column decoder circuit and the write data stored in the write latch.

Column select circuit 38 further includes a read sense amplifier (SA) circuit sensing current flowing in memory cell MC to be read through selected bit line BL, a verify sense amplifier circuit sensing current flowing in memory cell MC to be programmed or erased through selected bit line BL, and the like.

Following a command received from a host such as CPU 2 in FIG. 1, a control circuit 40 performs each operation mode such as the program pulse apply operation, the erase pulse apply operation, the read operation, the program verify operation, and the erase verify operation. Control circuit 40 further controls power supply circuit 50 and power supply switch circuit 60 so that an operating voltage necessary for each operation mode is supplied to each driver unit.

More specifically, control circuit 40 includes a main control unit 41 receiving a command from the host, a power supply circuit control unit 42, and a timing control unit 43. Power supply circuit control unit 42 controls power supply circuit 50 under control by main control unit 41. Timing control unit 43 controls the timing at which an operating voltage (boosted voltage VUCP) is supplied to each source line SL, by outputting a control signal SLDCTL to source line driver unit 33 under control by main control unit 41. Control signal SLDCTL which is output to source line driver unit 33 in the erase operation is also referred to herein as "erase pulse."

Timing control unit 43 further controls the timing at which an operating voltage is supplied to each memory gate line MGL, by outputting a control signal to memory gate line driver unit 37, and controls the timing at which an operating voltage is supplied to each control gate line CGL, by outputting a control signal to control gate line driver unit 36, which, however, is not shown in FIG. 4.

Power supply circuit 50 includes a charge pump circuit generating operating voltages of various magnitudes appropriate for respective operation modes, by positively boosting or negatively boosting internal power supply voltage VDD generated by power supply circuit 6 in FIG. 1.

For example, power supply circuit 50 includes a charge pump circuit 52 and a voltage detection unit 53 shown in FIG. 4 that serve as elements for generating boosted voltage VUCP to be supplied to a source line in the erase pulse apply operation. (In power supply circuit 50, a plurality of similar circuit elements are provided for generating operating voltages of various magnitudes appropriate for respective operation modes.)

Charge pump circuit 52 generates boosted voltage VUCP by boosting power supply voltage VDD based on a drive signal (clock) DRV from a ring oscillator (not shown).

Voltage detection unit 53 detects an output voltage (boosted voltage VUCP) of charge pump circuit 52, and compares a voltage which is generated by voltage division of boosted voltage VUCP, with a reference voltage Vref which is generated by a reference voltage generation circuit (not shown). When the voltage which is generated by voltage division of boosted voltage VUCP is equal to or higher than reference voltage Vref, voltage detection unit 53 causes control signal UCPOK to become an active state. Charge pump circuit 52 stops the boosting operation when it receives control signal UCPOK in the active state from voltage detection unit 53. Control signal UCPOK is also input to timing control unit 43. As will be detailed in connection with FIGS. 8 and 9, timing control unit 43 controls the timing of control signal SLDCTL to be output to source line driver SLD, based on control signal UCPOK.

Power supply switch circuit 60 is a group of switches (also referred to as distributor) receiving operating voltages of various magnitudes generated by power supply circuit 50 and changing the magnitude of the operating voltage to be supplied or the destination to which the operating voltage is supplied, based on each operation mode.

[Configuration of Memory Array]

Figure 5:
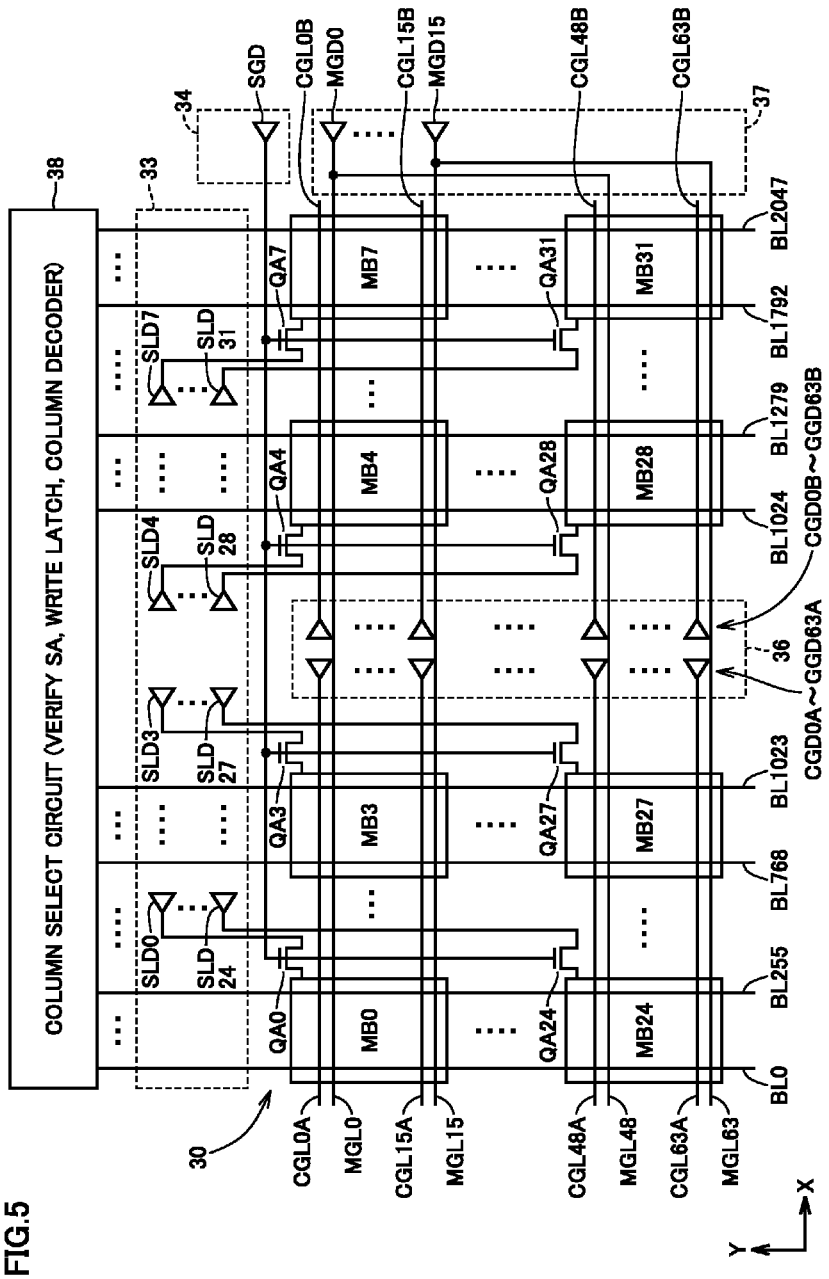
FIG. 5 is a plan view schematically showing a configuration of a memory array in FIG. 4.

FIG. 5 is a plan view schematically showing a configuration of the memory array in FIG. 4. In FIG. 5, each driver unit in the periphery of memory array 30 is also shown.

Memory array 30 shown in FIG. 5 is an example memory array in which memory cells MC in FIG. 2 are arranged in 64 rows and 4096 columns Memory array 30 is divided into 32 memory blocks MB0 to MB31 each made up of memory cells MC in 16 rows and 512 columns. In memory array 30, memory blocks MB0 to MB31 are therefore arranged in four lines and eight columns (FIG. 5 representatively shows eight memory blocks for ease of illustration). Memory blocks MB share source lines SL connected to each other.

Control gate line driver unit 36 is arranged in a central region in the X direction in memory array 30, and includes drivers CGD0A to CGD63A driving control gate lines CGL0A to CGL63A respectively on the left side in the drawing, and drivers CGD0B to CGD63B driving control gate lines CGL0B to CGL63B respectively on the right side in the drawing. Control gate lines CGL0A to CGL15A are used commonly to memory blocks MB0 to MB3, control gate lines CGL16A to CGL31A are used commonly to memory blocks MB8 to MB11, control gate lines CGL32A to CGL47A are used commonly to memory blocks MB16 to MB19, and control gate lines CGL48A to CGL63A are used commonly to memory blocks MB24 to MB27. Likewise, control gate lines CGL0B to CGL15B are used commonly to memory blocks MB4 to MB7, control gate lines CGL16B to CGL31B are used commonly to memory blocks MB12 to MB15, control gate lines CGL32B to CGL47B are used commonly to memory blocks MB20 to MB23, and control gate lines CGL48B to CGL63B are used commonly to memory blocks MB28 to MB31.

Memory gate line driver unit 37 includes drivers MGD0 to MGD15. Driver MGDi ($0 \leq i \leq 15$) drives memory gate lines MGLi, MGLi+16, MGLi+32, and MGLi+48. Memory gate lines MGL0 to MGL15 are used commonly to memory blocks MB0 to MB7, memory gate lines MGL16 to MGL31 are used commonly to memory blocks MB8 to MB15, memory gate lines MGL32 to MGL47 are used commonly to memory blocks MB16 to MB23, and memory gate lines MGL48 to MGL63 are used commonly to memory blocks MB24 to MB31.

Source line driver unit 33 includes drivers SLD0 to SLD31 driving source lines of memory blocks MB0 to MB31, respectively. Switching NMOS (Negative-channel Metal Oxide Semiconductor) transistors QA0 to QA31 are provided that correspond to drivers SLD0 to SLD31, respectively. Operating voltages that are output respectively from drivers SLD0 to SLD31 are supplied to common source lines SL provided in corresponding memory blocks MB, through corresponding NMOS transistors QA. NMOS transistors QA0 to QA31 are switched on or off based on a signal which is output from source line gate driver SGD.

From column select circuit 38, main bit lines BL0 to BL2047 are extended. One main bit line BL is provided for every two columns in memory array 30.

Figure 6:
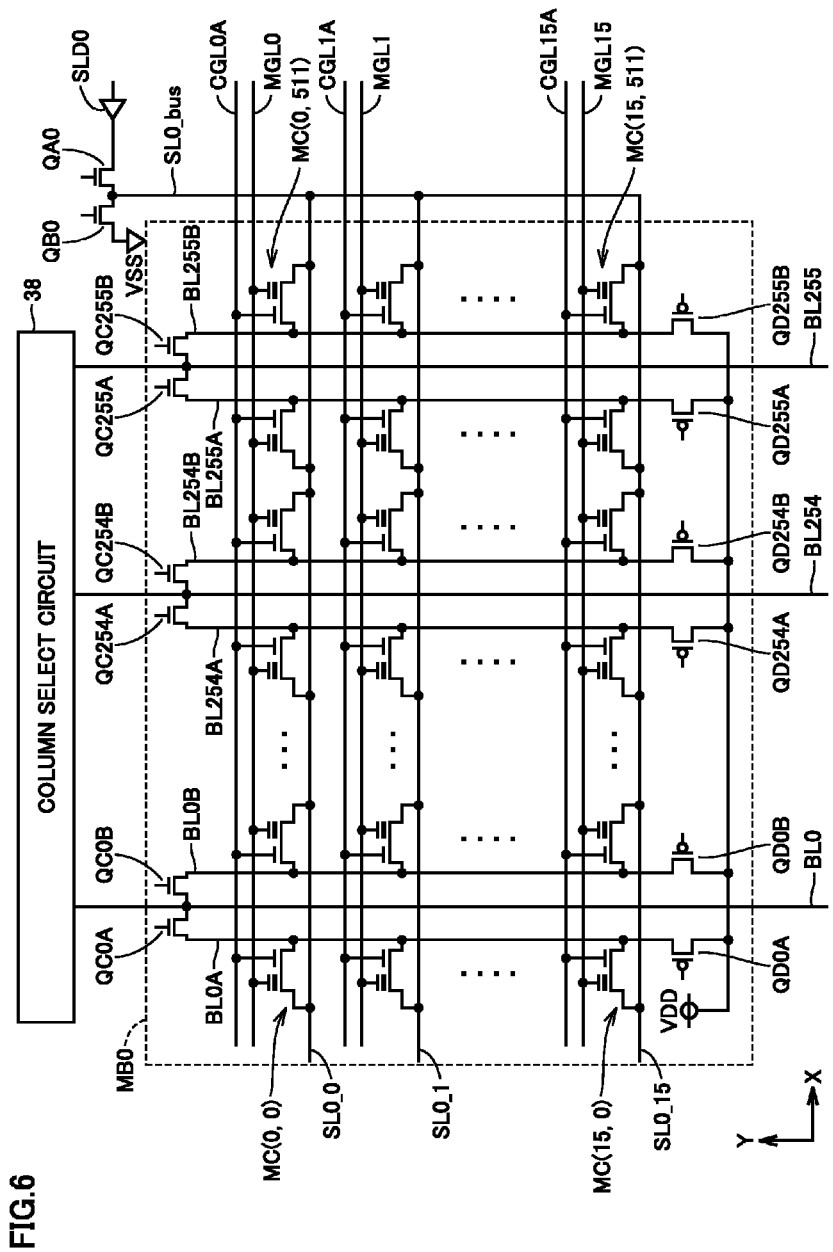
FIG. 6 is a circuit diagram showing a configuration of a memory block in FIG. 5.

FIG. 6 is a circuit diagram showing a configuration of a memory block in FIG. 5. Memory blocks MB1 to MB31 other than memory block MB0 shown in FIG. 5 are configured similarly. Therefore, regarding the configuration of memory block MB0 as a representative one, particularly source lines and sub bit lines provided in this memory block MB0 will be described in the following.

Referring to FIG. 6, there are provided source lines SL0_0 to SL0_15 corresponding respectively to the memory cell rows in memory block MB0. Source lines SL0_0 to SL0_15 each have one end connected to a line SL0_bus extending in the Y direction. Line SL0_bus has one end connected through NMOS transistor QA0 to source line driver SLD0 and also connected through switching NMOS transistor QB0 to a ground node VSS. In the case where a positive operating voltage is applied to the source of each memory cell MC, NMOS transistor QA0 is turned on and NMOS transistor QB0 is turned off. In the case where a ground voltage is applied to the source of each memory cell MC, NMOS transistor QA0 is turned off and NMOS transistor QB0 is turned on.

There are provided sub bit lines BL0A, BL0B, BL1A, BL1B, . . . , BL255A, BL255B corresponding respectively to the memory cell columns in memory block MB0. Sub bit lines BL0A, BL0B have respective ends connected to main bit line BL0 through switching NMOS transistors QC0A, QC0B, respectively. Sub bit lines BL0A, BL0B have respective other ends connected to a power supply node VDD through PMOS (Positive-channel Metal Oxide Semiconductor) transistors QD0A, QD0B, respectively. PMOS transistors QD0A, QD0B have respective gates to which a predetermined bias voltage is applied and are thus used as constant current sources. The remaining sub bit lines BLA, BLB are arranged as well, namely the sub bit lines have respective ends connected to a corresponding main bit line BL through switching transistors, respectively, and respective other ends connected to power supply node VDD through PMOS transistors as constant current sources, respectively.

[Changes in Output Voltage of Charge Pump Circuit in Erase Operation]

The following is a description of the erase operation in nonvolatile memory device 4 in the first embodiment.

Figure 7:
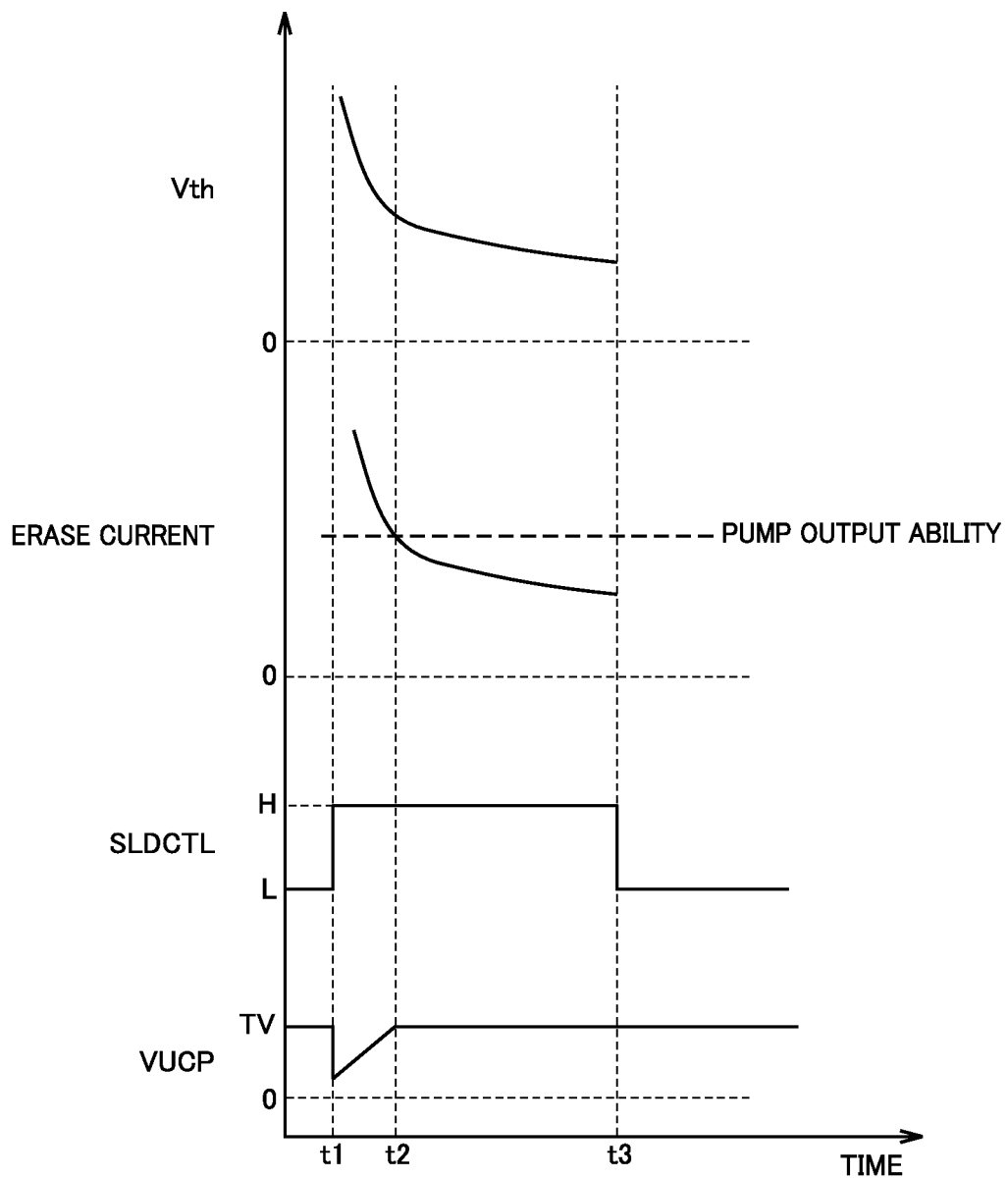
FIG. 7 is a diagram for illustrating changes in output current and output voltage of a charge pump circuit in an erase operation.

FIG. 7 is a diagram for illustrating changes in output current and output voltage of the charge pump circuit in the erase operation. In FIG. 7, respective waveforms of threshold voltage Vth of a memory cell, output current (erase current) of the charge pump circuit, control signal (erase pulse) SLDCTL which is output from timing control unit 43 of control circuit 40 in FIG. 4, and output voltage VUCP of charge pump circuit 52 in FIG. 4 are shown in order from the top.

Referring to FIGS. 4 and 7, in the period from time ti to t3 in FIG. 7, control signal SLDCTL supplied to source line driver SLD is an active state (H (High) level in the case of the first embodiment). In this period, positive high-voltage VUCP is applied to source region 24 of memory cell MC. At this time, a negative high-voltage is applied to memory gate MG. Therefore, in the portion of source region 24 that overlaps memory gate 23, electron-hole pairs are generated by band-to-band tunneling. The generated electrons reach source line SL and a part of the generated holes reaches substrate 20. The remaining part of the generated holes is accelerated in a high electric field to become hot holes which are injected into the charge storage portion (silicon nitride film 22). This injection of hot holes decreases threshold voltage Vth of memory cell MC. As hot holes are further injected into silicon nitride film 22, an electric field applied to source region 24 decreases. Thus, the erase current gradually decreases and saturates in the end.

Charge pump circuit 52 operates to keep output voltage VUCP at a target voltage TV by feedback control. In the period in which the erase pulse is applied (from time t1 to t3), however, initially (the period from time t1 to t2 in FIG. 7) relatively large erase current flows and the erase current thus exceeds an output ability of the charge pump circuit. Output voltage VUCP is therefore temporarily lower than target voltage TV. With the passage of time, the erase current decreases to become equal to or less than the output ability of the charge pump circuit. Then, output voltage VUCP of charge pump circuit 52 recovers to target voltage TV.

Here, it is the initial period (from time t1 to t2) in the erase pulse application period that threshold voltage Vth decreases greatly due to injection of hot holes in silicon nitride film 22. In view of this, the erase pulse can intensively be applied during the period in which the relatively large erase current flows (the period in which the relatively large erase current flows as compared with the period in which the erase current saturates) to thereby effectively decrease threshold voltage Vth in a shorter erase time.

Figure 8:
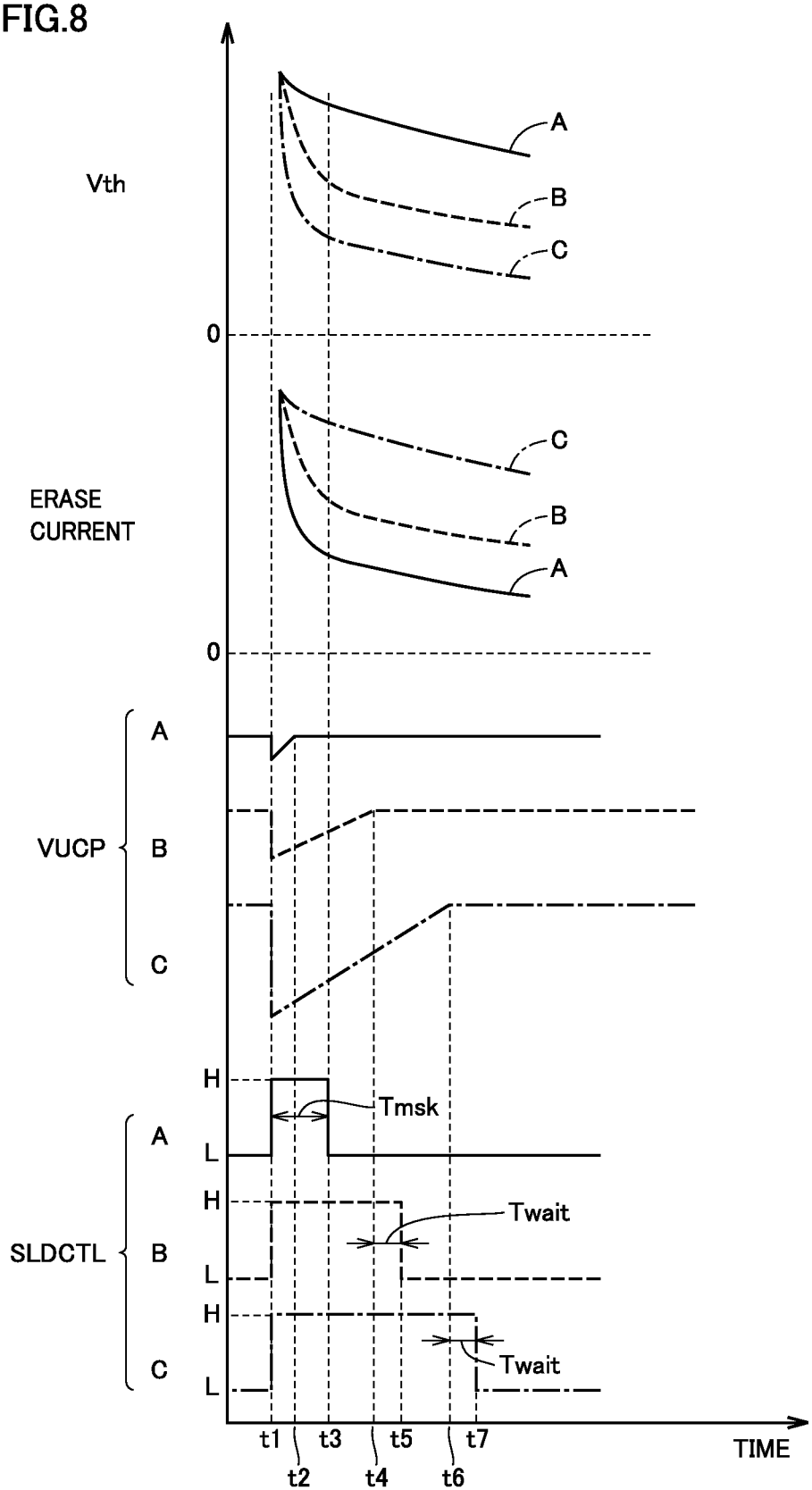
FIG. 8 is a diagram for illustrating how an appropriate erase-pulse application time is set.

FIG. 8 is a diagram for illustrating how an appropriate erase-pulse application time is set.

In FIG. 8, there are shown a case (A) where the erase current is relatively small and there is a small decrease of threshold voltage Vth, a case (C) where the erase current is relatively large and there is a large decrease of threshold voltage Vth, and an intermediate case (B) between them. In the case (A) where the erase current is relatively small, the period (from time t1 to t2 in FIG. 8) in which output voltage VUCP of charge pump circuit 52 temporarily decreases is relatively short. In the case (C) where the erase current is relatively large, the period (from time t1 to t6 in FIG. 8) in which output voltage VUCP temporarily decreases is relatively long. In the case (B) where the intermediate erase current therebetween flows, the period (from time t1 to t4 in FIG. 8) in which output voltage VUCP temporarily decreases is between those of A and C.

Accordingly, based on the period in which output voltage VUCP of charge pump circuit 52 temporarily decreases, the erase-pulse application time can be optimized. Specifically, when a predetermined wait time Twait has elapsed since recovery of output voltage VUCP of charge pump circuit 52, control signal SLDCTL of source line driver SLD is returned to an inactive state (L (Low) level in the case of the first embodiment) to thereby end application of the erase pulse. For example, in the case (B) where the intermediate erase current flows, control signal SLDCTL is activated during the period from time t1 to t5. In the case (C) where the relatively large erase current flows, control signal SLDCTL is activated during the period from time t1 to t7. While wait time Twait is set in advance in consideration of shortening of the erase time, the wait time may also be set to zero.

It should be noted that depending on process conditions and characteristics of individual semiconductor devices, the magnitude of the erase current can be approximately equal to or less than the current supply ability of the charge pump circuit. In this case, there is substantially no decrease of the output voltage of charge pump circuit 52. Therefore, if the erase-pulse application time is determined based solely on information about recovery of the output voltage of charge pump circuit 52, the erase time can be excessively short and almost no hot holes can be injected into silicon nitride film 22. A resultant problem is a disadvantageously long erase time. Taking this into account, the first embodiment sets a minimum erase-pulse application time (also referred to as "mask period Tmsk"). In FIG. 8, in the case (A) where the erase current is relatively small, control signal SLDCTL applied to source line driver SLD is the active state (H level) during this mask period Tmsk.

[Specific Erase Operation in the Case of First Embodiment]

Figure 9:
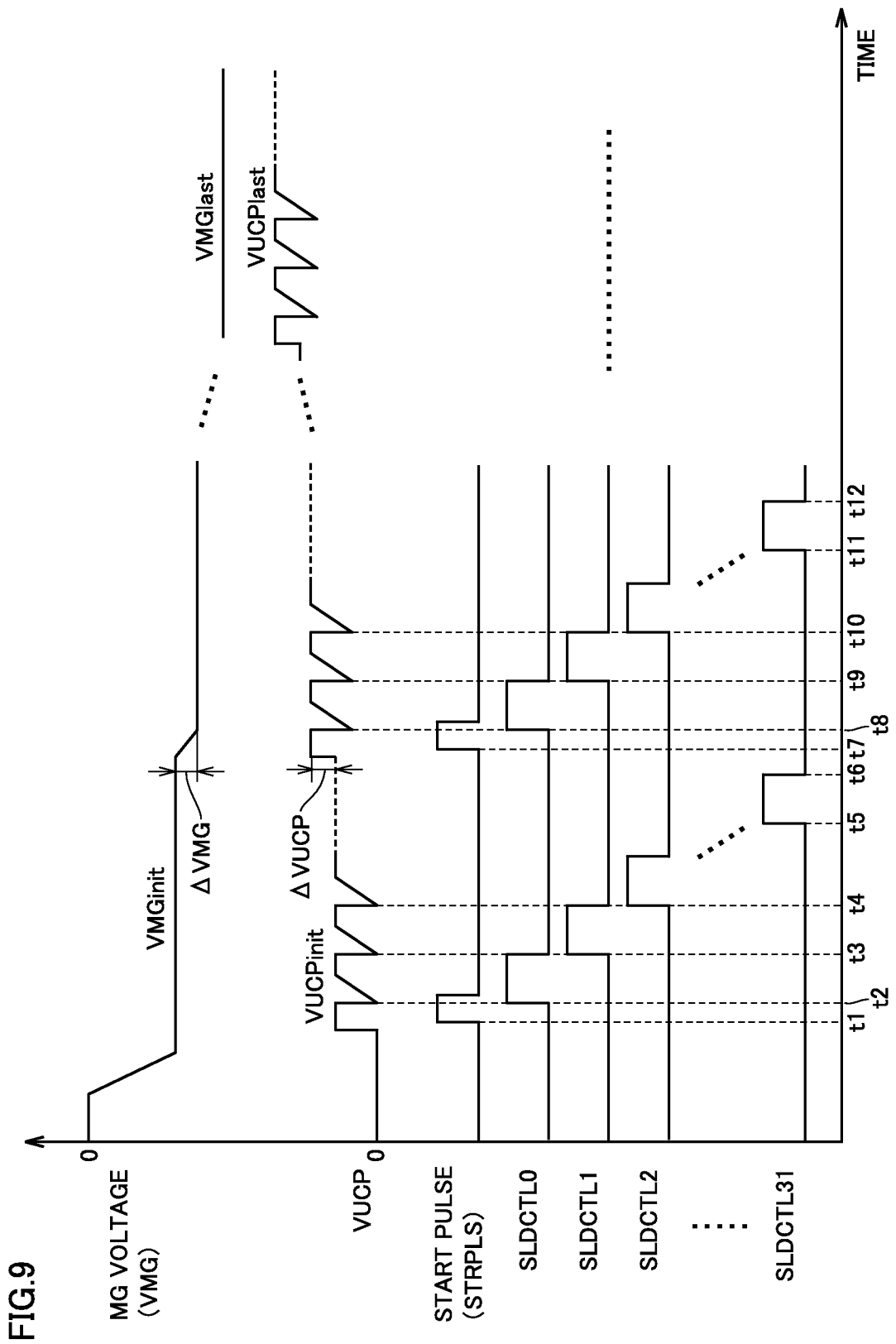
FIG. 9 is a diagram for illustrating an erase operation in the nonvolatile memory device shown in FIGS. 4 to 6.

FIG. 9 is a diagram for illustrating the erase operation in the nonvolatile memory device shown in FIGS. 4 to 6. In FIG. 9, respective waveforms of a voltage (memory gate voltage VMG) applied to memory gate MG of each memory cell MC in memory array 30, output voltage VUCP of charge pump circuit 52, start pulse signal STRPLS, and control signals (erase pulses) SLDCTL0 to SLDCTL31 supplied respectively to source line drivers SLD0 to SLD31 are shown in order from the top.

In the case where relatively large current flows in a memory cell in the erase operation like the erase scheme utilizing band-to-band tunneling, the number of memory cells that can be erased simultaneously is limited due to the limitation of the current supply ability of the charge pump circuit. Therefore, in nonvolatile memory device 4 in FIGS. 4 to 6, a high voltage (boosted voltage VUCP) is applied to the source line for each of memory blocks MB0 to MB31.

Referring to FIG. 9, in the erase operation, firstly memory gate voltage VMG and output voltage VUCP of charge pump circuit 52 are set to initial values VMGinit and VUCPinit, respectively. It is supposed that transistor QA in FIG. 4 is the ON state.

At subsequent time t1, main control unit 41 in FIG. 4 outputs start pulse signal STRPLS to timing control unit 43. In response to the fact that start pulse signal STRPLS has changed to the active state (H level in the case of the first embodiment), timing control unit 43 causes, at time t2, control signal SLDCTL0 supplied to source line driver SLD0 to become the active state (H level in the case of the first embodiment). Accordingly, output voltage VUCP of charge pump circuit 52 is applied to the source line of memory block MB0. Due to the limited current supply ability of charge pump circuit 52, output voltage VUCP is temporarily decreased (under the condition that transistor QA in FIG. 4 is ON).

When output voltage VUCP of charge pump circuit 52 has recovered to a target voltage (initial value VUCPinit), voltage detection unit 53 in FIG. 4 causes control signal UCPOK to become the active state. In response to the fact that control signal UCPOK has been activated, timing control unit 43 causes, at time t3, control signal SLDCTL0 supplied to source line driver SLD0 to become the inactive state (L level in the case of the first embodiment), and causes, at time t3, control signal SLDCTL1 supplied to source line driver SLD1 to become the active state (H level). It should be noted that this switching of the control signals is made after predetermined mask period Tmsk described in connection with FIG. 8 has elapsed since activation of control signal SLDCTL0. Consequently, application of boosted voltage VUCP to the source line of memory block MB0 is ended and application of boosted voltage VUCP to the source line of memory block MB1 is started.

Then, in response to the fact that output voltage VUCP of charge pump circuit 52 has recovered to the target voltage (initial value VUCPinit) and consequently control signal UCPOK has been activated, timing control unit 43 deactivates control signal SLDCTL1 and activates control signal SLDCTL2 supplied to source line driver SLD2 at time t4. It should be noted this switching of the control signals is made after predetermined mask period Tmsk has elapsed since activation of control signal SLDCTL1.

After this, under similar control to the above, timing control unit 43 in FIG. 4 successively activates control signals SLDCTL3 to SLDCTL31 supplied respectively to source line drivers SLD3 to SLD31. Namely, when timing control unit 43 activates the (i+1)-th ($1 \leq i \leq 30$) control signal SLDCTLi, timing control unit 43 deactivates the i-th control signal SLDCTLi−1. At time t6 in FIG. 9, the last control signal SLDCTL31 is returned to the inactive state (L level). The period from time t1 to time t6 is herein referred to as "one cycle."

When one cycle of the erase operation is ended, the set value of memory gate voltage VMG has decreased by a predetermined voltage width $\Delta$VMG and output voltage VUCP of charge pump circuit 52 has increased by a predetermined voltage width $\Delta$VUCP. Accordingly, a higher voltage is applied between source region 24 and memory gate 23 of memory cell MC.

In the subsequent period from time t7 to t12, one cycle of the erase operation similar to that from time t1 to t6 is performed with this new memory gate voltage VMG and the set value of output voltage VUCP of charge pump circuit 52. Namely, under a new high voltage, the operation of further decreasing the threshold voltage of memory cell MC is performed. The memory cell in which the erase current temporarily saturated from time t1 to t6 exhibits again the characteristics of the erase current as shown in FIG. 7 under the new high voltage.

Each time one cycle of the erase operation is ended, the set value of memory gate voltage VMG has further decreased by a predetermined voltage width $\Delta$VMG and the set value of output voltage VUCP of charge pump circuit 52 has further increased by a predetermined voltage width $\Delta$VUCP. Accordingly, as the following cycles proceed, a higher voltage is applied between source region 24 and memory gate 23 of memory cell MC.

For example, after a few cycles of the erase operation has been ended and the set value of memory gate voltage VMG has been decreased to a certain extent, an erase verify operation is performed each time one cycle of the erase operation is completed. Apparently, from the beginning, the erase verify operation may be performed each time one cycle of the erase operation is completed. The erasure is completed when it is confirmed that the threshold voltage of each memory cell MC is lower than the erase verify voltage.

[Effects of First Embodiment]

In accordance with the first embodiment, each erase-pulse application time is automatically adjusted to an optimum time regardless of variations of manufacture processes and individual semiconductor devices, and therefore, the erase time of the whole memory array can further be shortened. At this time, since the minimum erase-pulse application time (mask period Tmsk) has been determined, the erase-pulse application time will not be excessively shortened even in the case where the output voltage of the charge pump circuit does not substantially decrease when the erase pulse is applied.

Further, the above-described erase operation can narrow the width of distribution of the threshold voltage of each memory cell after erased, which will be described below with reference to FIGS. 10A and 10B.

Figure 10A:
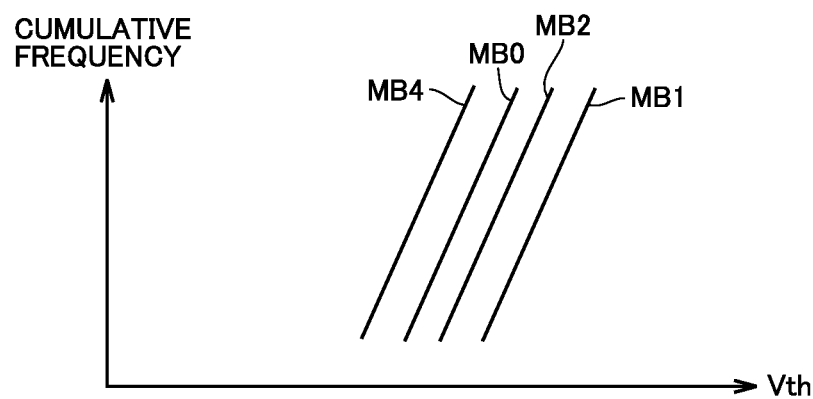
FIG. 10A is a diagram showing a distribution of the threshold voltage for each memory block in the case where data is erased by the conventional erase operation.
Figure 10B:
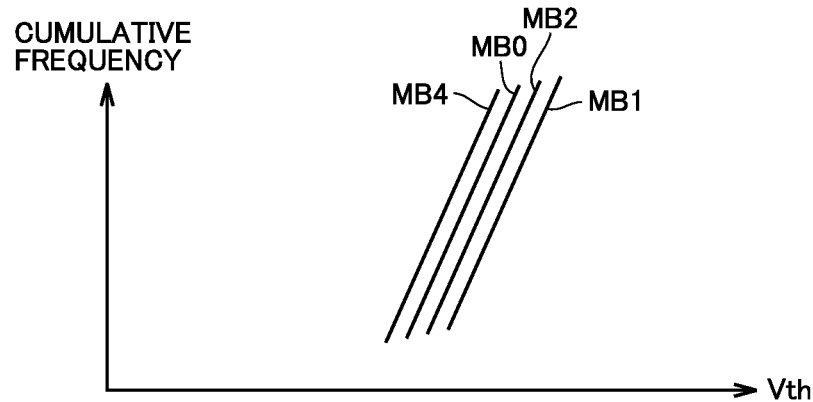
FIG. 10B is a diagram showing a distribution of the threshold voltage for each memory block in the case where data is erased by the erase operation in the case of the first embodiment.

FIG. 10A is a diagram showing a distribution of the threshold voltage for each memory block in the case where data is erased by the conventional erase operation. FIG. 10B is a diagram showing a distribution of the threshold voltage for each memory block in the case where data is erased by the erase operation in the case of the first embodiment. In FIGS. 10A and 10B, the vertical axis represents cumulative frequency and the horizontal axis represents threshold voltage Vth of each memory cell.

In the erase operation in the case of the first embodiment, the time for which boosted voltage VUCP is applied to the source line for each memory block is optimized, and therefore, the amount of shift of the threshold voltage is also optimized. Consequently, differences between respective threshold voltages for memory blocks are decreased, and therefore, the distribution of the threshold voltage of the memory array as a whole after erased can further be reduced. In other words, the erase-pulse application time is automatically adjusted to an optimum time for each memory block to be erased.

Second Embodiment

In the first embodiment, the periods in which control signals SLDCTL0 to SLDCTL31 supplied respectively to source line drivers SLD0 to SLD31 are the active state do not overlap each other. Namely, after supply of boosted voltage VUCP to the source line of the current memory block is ended, supply of boosted voltage VUCP to the source line of the next memory block is started.

In a second embodiment, the periods (pulse widths) in which control signals SLDCTL0 to SLDCTL31 are the active state respectively are fixed. The periods in which control signals SLDCTL0 to SLDCTL31 are the active state respectively accordingly overlap each other.

The specific hardware configuration of a nonvolatile memory device 4 in the second embodiment is similar to that in FIGS. 4 to 6 of the first embodiment, and therefore, the description thereof will not be repeated. The second embodiment differs from the first embodiment in terms of the operation of timing control unit 43 in FIG. 4.

[Erase Operation in the Case of Second Embodiment]

Figure 11:
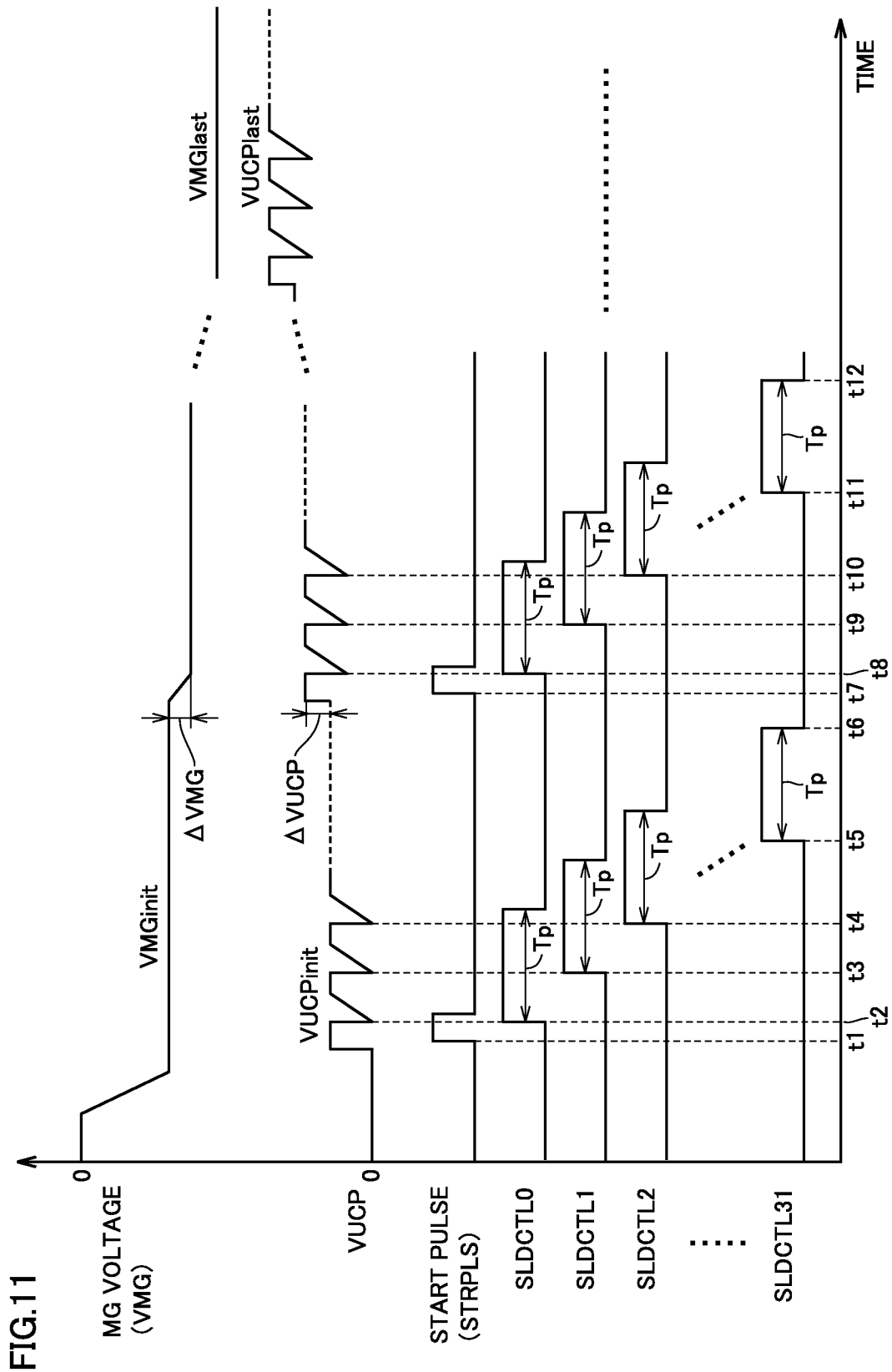
FIG. 11 is a diagram for illustrating an erase operation of a nonvolatile memory device in a second embodiment.

FIG. 11 is a diagram for illustrating an erase operation of the nonvolatile memory device in the second embodiment. In FIG. 11, respective waveforms of memory gate voltage VMG supplied to each memory cell MC of memory array 30 in FIG. 4, output voltage VUCP of charge pump circuit 52, start pulse signal STRPLS, and control signals SLDCTL0 to SLDCTL31 supplied respectively to source line drivers SLD0 to SLD31 are shown in order from the top.

Referring to FIG. 11, in the erase operation, firstly memory gate voltage VMG and output voltage VUCP of charge pump circuit 52 are set to initial values VMGinit and VUCPinit, respectively.

At subsequent time t1, main control unit 41 in FIG. 4 outputs start pulse signal STRPLS to timing control unit 43. In response to the fact that start pulse signal STRPLS has changed to the active state (H level in the case of the second embodiment), timing control unit 43 causes, at time t2, control signal SLDCTL0 supplied to source line driver SLD0 to become the active state (H level in the case of the second embodiment). Accordingly, output voltage VUCP of charge pump circuit 52 is applied to the source line of memory block MB0. Due to the limited current supply ability of charge pump circuit 52, output voltage VUCP is temporarily decreased.

When output voltage VUCP of charge pump circuit 52 has recovered to a target voltage (initial value VUCPinit), voltage detection unit 53 in FIG. 4 causes control signal UCPOK to become the active state. In response to the fact that control signal UCPOK has been activated, timing control unit 43 causes, at time t3, control signal SLDCTL1 supplied to source line driver SLD1 to become the active state (H level). It should be noted that this switching of the control signal is made after predetermined mask period Tmsk described in connection with FIG. 8 has elapsed since activation of control signal SLDCTL0. Consequently, application of boosted voltage VUCP to the source line of memory block MB1 is started. At this time, control signal SLDCTL0 supplied to source line driver SLD0 is kept in the active state.

Then, in response to the fact that output voltage VUCP of charge pump circuit 52 has recovered to the target voltage (initial value VUCPinit) and consequently control signal UCPOK has been activated, timing control unit 43 activates control signal SLDCTL2 supplied to source line driver SLD2 at time t4. It should be noted this switching of the control signals is made after predetermined mask period Tmsk has elapsed since activation of control signal SLDCTL1.

After this, under similar control to the above, timing control unit 43 in FIG. 4 successively activates control signals SLDCTL3 to SLDCTL31 supplied respectively to source line drivers SLD3 to SLD31.

Timing control unit 43 switches each of control signals SLDCTL0 to SLDCTL31 to the inactive state when a predetermined fixed period Tp has elapsed since switching of each control signal to the active state. Therefore, to the source line of each memory block, boosted voltage VUCP is applied during the predetermined fixed period Tp.

At time t6, the last control signal SLDCTL31 is returned to the inactive state (L level). At the time when one cycle of the erase operation (from time t1 to t6) is ended, the set value of memory gate voltage VMG has decreased by a predetermined voltage width ΔVMG and output voltage VUCP of charge pump circuit 52 has increased by a predetermined voltage width ΔVUCP. Accordingly, a higher voltage is applied between source region 24 and memory gate 23 of memory cell MC.

In the subsequent period from time t7 to t12, one cycle of the erase operation similar to that from time t1 to t6 is performed with this new memory gate voltage VMG and the set value of output voltage VUCP of charge pump circuit 52.

Each time one cycle of the erase operation is ended, the set value of memory gate voltage VMG has further decreased by a predetermined voltage width ΔVMG and the set value of output voltage VUCP of charge pump circuit 52 has further increased by a predetermined voltage width ΔVUCP. Accordingly, as the following cycles proceed, a higher voltage is applied between source region 24 and memory gate 23 of memory cell MC.

After a few cycles of the erase operation has been ended, an erase verify operation is performed each time one cycle of the erase operation is completed. The erasure is completed when it is confirmed that the threshold voltage of each memory cell MC is lower than the erase verify voltage.

[Effects of Second Embodiment]

In accordance with the second embodiment, the time from the start of supply of control signal SLDCTLi to a certain source line driver SLDi (0≤i≤30) to the start of supply of control signal SLDCTLi+1 to the next source line driver SLDi+1 (hereinafter referred to as "transition time") can be optimized based on the timing when the output voltage of the charge pump circuit is recovered. At this time, since a minimum transition time (mask period Tmsk) has been determined, the transition time will not be excessively shortened even in the case where the output voltage of the charge pump circuit does not substantially decrease when the erase pulse is applied.

Further, in the case of the second embodiment, each erase-pulse application time Tp is fixed. Therefore, even after the start of supply of control signal SLDCTLi+1 to the next source line driver SLDi+1 (0≤i≤30), supply of control signal SLDCTLi to the preceding source line driver SLDi is continued. In memory block MBi corresponding to the preceding source line driver SLDi, injection of hot holes into silicon nitride film 22 of each memory cell MC is continued, although the amount of the injected hot holes is a slight amount, and accordingly the threshold voltage is decreased. Consequently, the erase time of the memory array as a whole can further be shortened as compared with the first embodiment.

Third Embodiment

In a third embodiment, there is provided a nonvolatile memory device capable of achieving both the erase operations of the first and second embodiments by switching a set signal of an erase mode. In the following description, the erase operation in the first embodiment is performed in a first erase mode and the erase operation in the second embodiment is performed in a second erase mode. The following is a specific description of a configuration and an operation of the nonvolatile memory device in the third embodiment.

[As to Control Signals Between Control Circuit and Power Supply Circuit]

Figure 12:
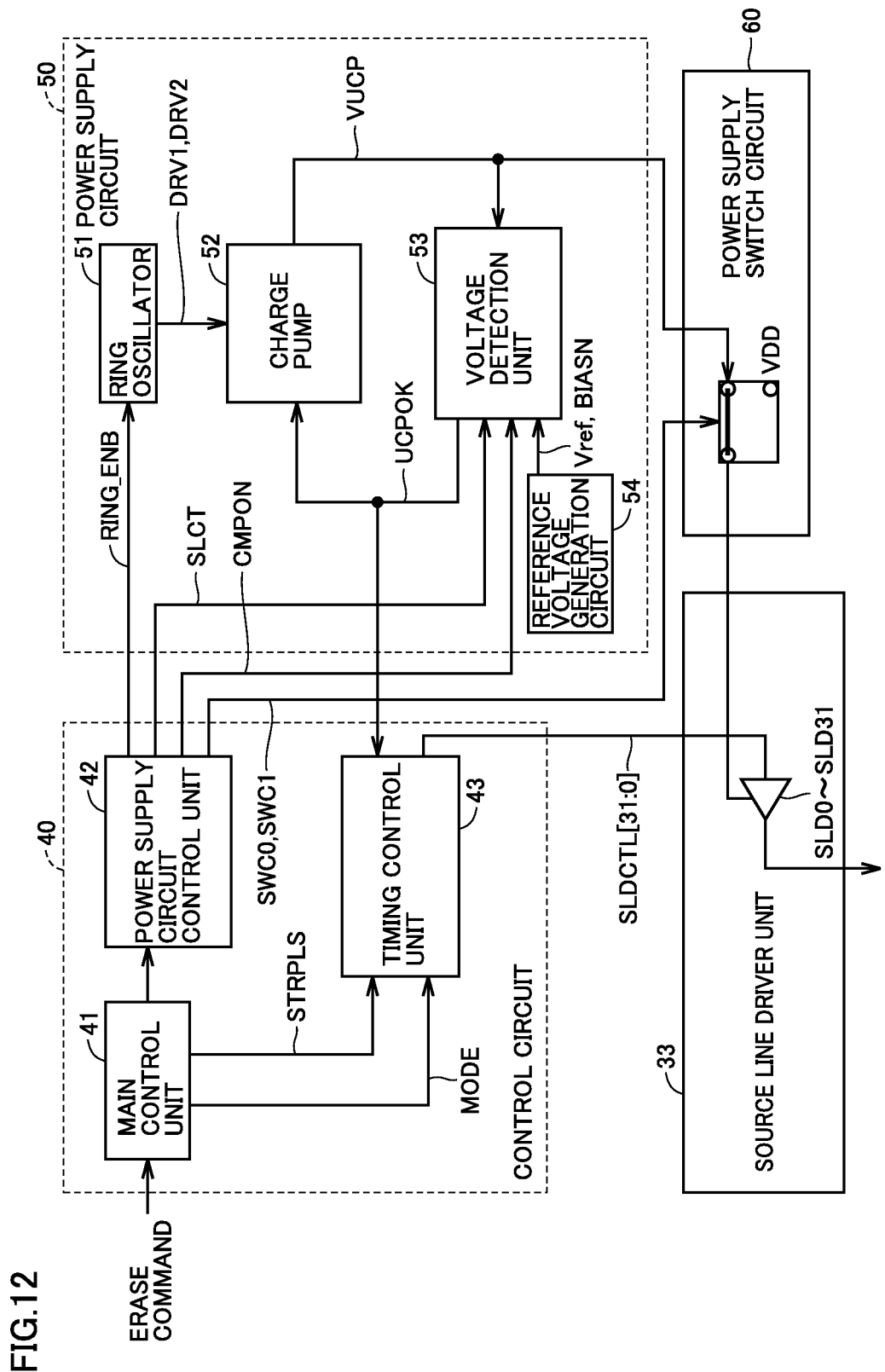
FIG. 12 is a diagram for illustrating control signals running between a control circuit and a power supply circuit in the nonvolatile memory device in FIG. 4.

FIG. 12 is a diagram for illustrating control signals running between a control circuit and a power supply circuit in the nonvolatile memory device in FIG. 4. Referring to FIG. 12, control circuit 40 includes a main control unit 41, a power supply circuit control unit 42, and a timing control unit 43. Power supply circuit 50 includes a ring oscillator 51, a charge pump circuit 52, a voltage detection unit 53, and a reference voltage generation circuit 54.

Main control unit 41 outputs to timing control unit 43 a mode set signal MODE for setting the erase mode and also outputs to timing control unit 43 a start pulse signal STRPLS in response to input of an erase command. Mode set signal MODE switches the first erase mode (first embodiment) and the second erase mode (second embodiment) to each other.

Following control by main control unit 41, power supply circuit control unit 42 outputs to ring oscillator 51 an enable signal RING_ENB for enabling an oscillate operation of the ring oscillator. Power supply circuit control unit 42 further outputs to voltage detection unit 53 an operation signal CMPON for making a comparator operable as well as a select signal SLCT for selecting a voltage division ratio of a voltage divider. Power supply circuit control unit 42 further outputs to power supply switch circuit 60 control signals SWC0, SWC1 for controlling switching of a switch.

Ring oscillator 51 outputs drive signals DRV1, DRV2 to charge pump circuit 52. Drive signals DRV1, DRV2 are clock signals having respective phases different by 180° from each other.

Reference voltage generation circuit 54 generates a reference voltage Vref to be used for comparison with a voltage generated by voltage division of output voltage VUCP of charge pump circuit 52, and a bias voltage BIASN supplied to a MOS (Metal Oxide Semiconductor) transistor for a constant current source. Reference voltage generation circuit 54 outputs to voltage detection unit 53 the generated reference voltage Vref and bias voltage BIASN.

When the voltage generated by voltage division of output voltage VUCP becomes equal to or higher than reference voltage Vref, voltage detection unit 53 causes control threshold UCPOK to become the active state (H level in the case of the third embodiment). Control signal UCPOK is output to charge pump circuit 52 and timing control unit 43.

[Example Configuration of Ring Oscillator]

Figure 13:
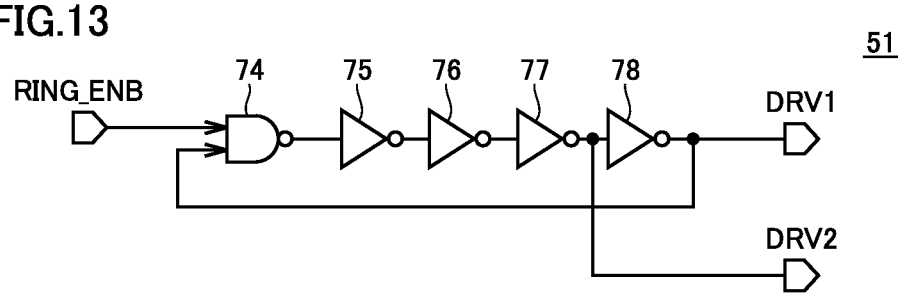
FIG. 13 is a circuit diagram showing an example configuration of a ring oscillator in FIG. 12.

FIG. 13 is a circuit diagram showing an example configuration of the ring oscillator in FIG. 12. Referring to FIG. 13, ring oscillator 51 includes a NAND gate 74 and inverters 75 to 78 connected in series on a passage of a loop-shaped oscillation signal.

To a first input node of NAND gate 74, an output signal of inverter 78 is input. To a second input node of NAND gate 74, enable signal RING_ENB is input. Thus, when enable signal RING_ENB becomes the active state (H level in the case of the third embodiment), ring oscillator 51 starts its oscillate operation.

An output signal of inverter 78 is output as drive signal DRV1 to charge pump circuit 52 in FIG. 12. An output signal of inverter 77 provided in the stage preceding inverter 78 is output as drive signal DRV2 to charge pump circuit 52. Drive signal DRV2 has its phase opposite to that of drive signal DRV1.

[Example Configuration of Charge Pump Circuit]

Figure 14:
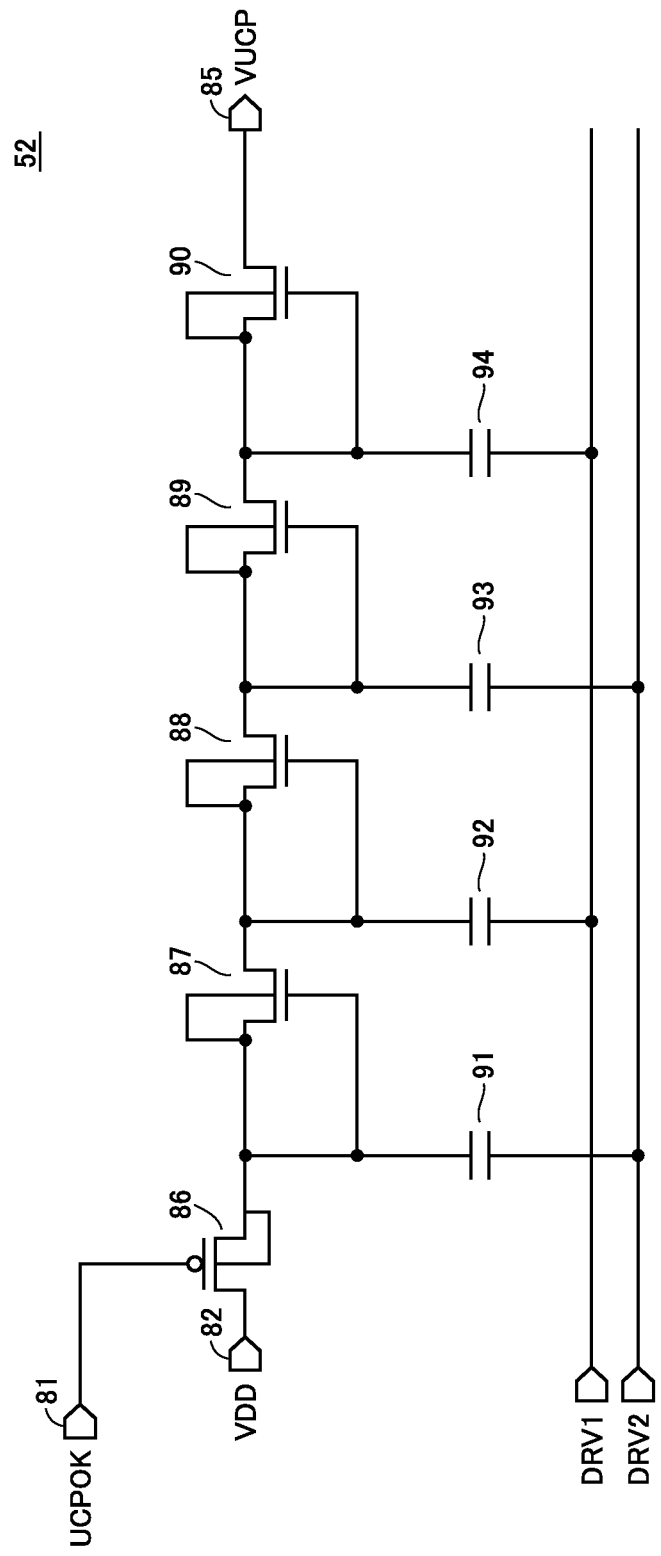
FIG. 14 is a circuit diagram showing an example configuration of a charge pump circuit in FIG. 12.

FIG. 14 is a circuit diagram showing an example configuration of the charge pump circuit in FIG. 12. Charge pump circuit 52 in FIG. 14 is a charge pump circuit proposed by Dickson.

Referring to FIG. 14, charge pump circuit 52 includes a PMOS (Positive-channel MOS) transistor 86 and NMOS (Negative-channel MOS) transistors 87 to 90 that are connected in series between an input node 82 to which a power supply voltage VDD is input and an output node 85 from which a boosted voltage VUCP is output, and also includes capacitors 91 to 94.

PMOS transistor 86 has its gate receiving control signal UCPOK. PMOS transistor 86 is switched to the OFF state when control signal UCPOK becomes the active state (H level in the case of the third embodiment). Consequently, the oscillate operation of charge pump circuit 52 is stopped. Namely, this also means that activation of control signal UCPOK substantially instructs deactivation of the charge pump circuit.

NMOS transistors 87 to 90 are each a so-called diode-connected transistor having its drain and gate connected to each other. To the drains of NMOS transistors 87 to 90, corresponding ends of capacitors 91 to 94 are connected, respectively.

To the other ends of capacitors 91, 93, drive signal DRV1 is supplied. To the other ends of capacitors 92, 94, drive signal DRV2 is supplied. Accordingly, NMOS transistors 87 to 90 alternately become the ON state to serve as a charge transfer switch transferring positive charge in the direction from input node 82 toward output node 85.

[Example Configuration of Voltage Detection Unit]

Figure 15:
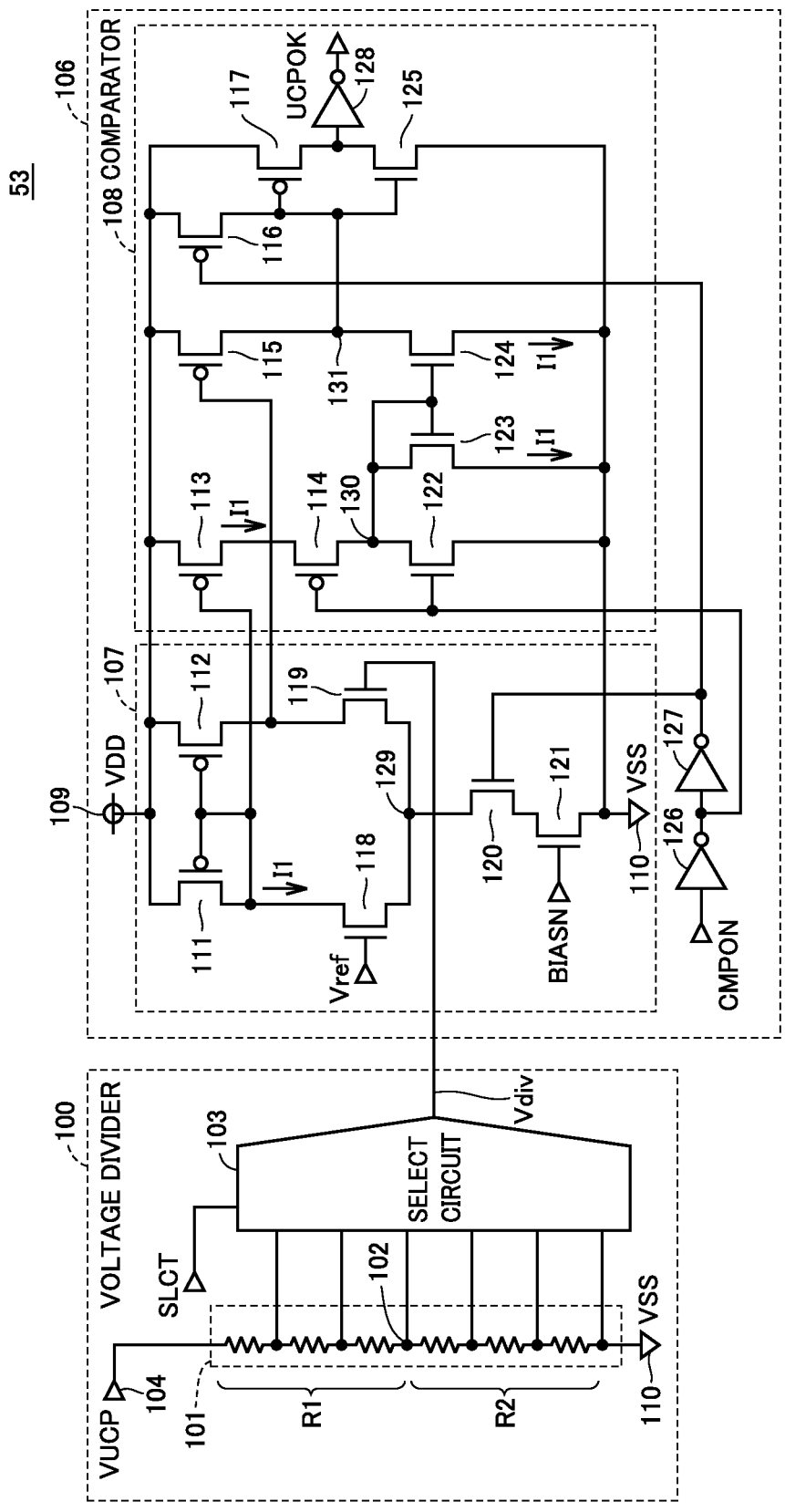
FIG. 15 is a circuit diagram showing an example configuration of a voltage detection unit in FIG. 12.

FIG. 15 is a circuit diagram showing an example configuration of the voltage detection unit in FIG. 12. Referring to FIG. 15, voltage detection unit 53 includes a voltage divider 100 generating a voltage by voltage division of output voltage VUCP (boosted voltage VUCP) of charge pump circuit 52, and a comparator 106 comparing an output voltage (voltage generated by voltage division) of the voltage divider and reference voltage Vref with each other.

Voltage divider 100 includes a plurality of resistive elements 101 connected in series between an input node 104 to which boosted voltage VUCP is input and a ground node 110 (VSS), and a select circuit 103. In response to select signal SLCT, select circuit 103 selects one of connection nodes of a plurality of resistive elements 101 and outputs a voltage of the selected connection node. For example it is supposed that a connection node 102 in FIG. 15 is selected. Then, a voltage Vdiv generated by voltage division is defined as $$Vdiv = VUCP \times R2/(R1+R2)$$

where R1 is a resistance value between input node 104 and connection node 102, and R2 is a resistance value between connection node 102 and ground node 110. In view of this, in order to obtain a still greater boosted voltage VUCP, select circuit 103 selects a connection node that makes resistance value R2 smaller.

Comparator 106 includes a differential stage 107, an output stage 108, and inverters 126, 127. Differential stage 107 includes PMOS transistors 111, 112 and NMOS transistors 118 to 121.

PMOS transistor 111 and NMOS transistor 118 are series-connected in this order between a power supply node 109 (VDD) and a node 129. PMOS transistor 112 and NMOS transistor 119 are series-connected in this order between power supply node 109 (VDD) and node 129. The gate of PMOS transistor 112 is connected to the gate and drain of PMOS transistor 111. PMOS transistors 111, 112 constitute a current mirror pair. To the gate of NMOS transistor 118, reference voltage Vref is input. To the gate of NMOS transistor 119, the output voltage (voltage generated by voltage division of boosted voltage VUCP) of voltage divider 100 is input. NMOS transistors 118, 119 constitute a differential pair.

NMOS transistors 120, 121 are connected in this order between node 129 and ground node 110 (VSS). To the gate of NMOS transistor 120, operation signal CMPON is input through inverters 126, 127. Thus, NMOS transistor 120 functions as a switch that becomes an electrically conductive state when operation signal CMPON becomes the active state (H level). To the gate of NMOS transistor 121, bias voltage BIASN is input. NMOS transistor 121 functions as a constant current source.

Output stage 108 includes PMOS transistors 113 to 117, NMOS transistors 122 to 125, and an inverter 128. Of these transistors, PMOS transistor 114 functions as a switch that becomes an electrically conductive state when operation signal CMPON becomes the active state (H level), and PMOS transistor 116 and NMOS transistor 112 each function as a switch that becomes an electrically non-conductive state when operation signal CMPON becomes the active state (H level).

When operation signal CMPON is the active state (H level), PMOS transistor 113 and NMOS transistor 123 are connected in series between power supply node 109 (VDD) and ground node 110 (VSS). PMOS transistor 115 and NMOS transistor 124 are connected in series between power supply node 109 (VDD) and ground node 110 (VSS), and PMOS transistor 117 and NMOS transistor 125 are connected in series between power supply node 109 (VDD) and ground node 110 (VSS).

PMOS transistor 113 constitutes a current mirror together with PMOS transistor 111, and NMOS transistor 123 constitutes a current mirror together with NMOS transistor 124. Therefore, the same current I1 flows in these transistors.

The gate of PMOS transistor 115 is connected to the drain of PMOS transistor 112, and drain 131 of PMOS transistor 115 is connected to respective gates of PMOS transistor 117 and NMOS transistor 125. A voltage of the drain common to PMOS transistor 117 and NMOS transistor 125 is inverted by inverter 128 into an inverted signal and this inverted signal is output as control signal UCPOK.

In the above-described configuration of comparator 106, when voltage Vdiv generated through voltage division of the output voltage (boosted voltage VUCP) by voltage divider 100 becomes larger than reference voltage Vref, the current flowing in NMOS transistor 119 becomes larger than current I1. Consequently, PMOS transistor 115 and NMOS transistor 125 become the ON state to cause control signal UCPOK to become the H level.

[Example Configurations of Power Supply Switch Circuit and Source Line Driver Unit]

Figure 16:
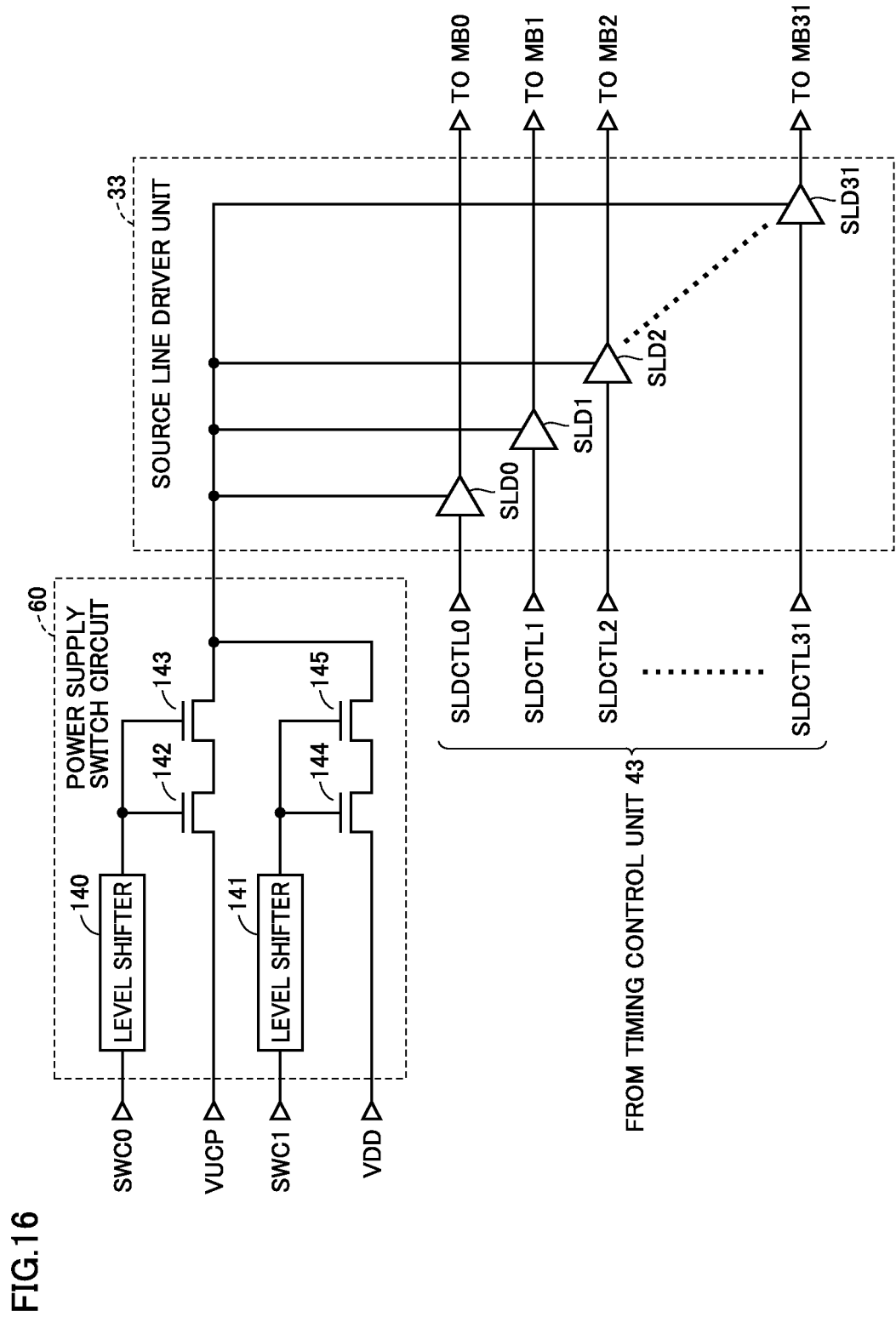
FIG. 16 is a circuit diagram showing an example configuration of a part of a power supply switch circuit in FIG. 12 and an example configuration of a source line driver unit in FIG. 12.

FIG. 16 is a circuit diagram showing an example configuration of a part of the power supply switch circuit in FIG. 12 and an example configuration of the source line driver unit in FIG. 12.

Referring to FIG. 16, power supply switch circuit 60 includes level shifters 140, 141 and switching NMOS transistors 142 to 145. Output voltage (boosted voltage) VUCP of charge pump circuit 52 in FIG. 12 is input through NMOS transistors 142, 143 to power supply terminals of source line drivers SLD0 to SLD31. Power supply voltage VDD is input through NMOS transistors 144, 145 to power supply terminals of source line drivers SLD0 to SLD31.

Control signal SWC0 is input through level shifter 140 to the gates of NMOS transistors 142, 143. Level shifter 140 converts the voltage level of control signal SWC0 into the voltage level of boosted voltage VUCP. Control signal SWC1 is input through level shifter 141 to the gates of NMOS transistors 144, 145. Level shifter 141 converts the voltage level of control signal SWC1 into the voltage level of power supply voltage VDD.

In the above-described configurations, when control signal SWC0 is the H level and control signal SWC1 is the L level, boosted voltage VUCP is input to the power supply terminals of source line drivers SLD0 to SLD31. On the contrary, when control signal SWC0 is the L level and control signal SWC1 is the H level, power supply voltage VDD is input to the power supply terminals of source line drivers SLD0 to SLD31. In accordance with corresponding control signals SLDCTL0 to SLDCTL31, source line drivers SLD0 to SLD31 supply boosted voltage VUCP (or power supply voltage VDD) to the source lines of corresponding memory blocks MB0 to MB31.

[Configuration of Timing Control Unit]

Figure 17:
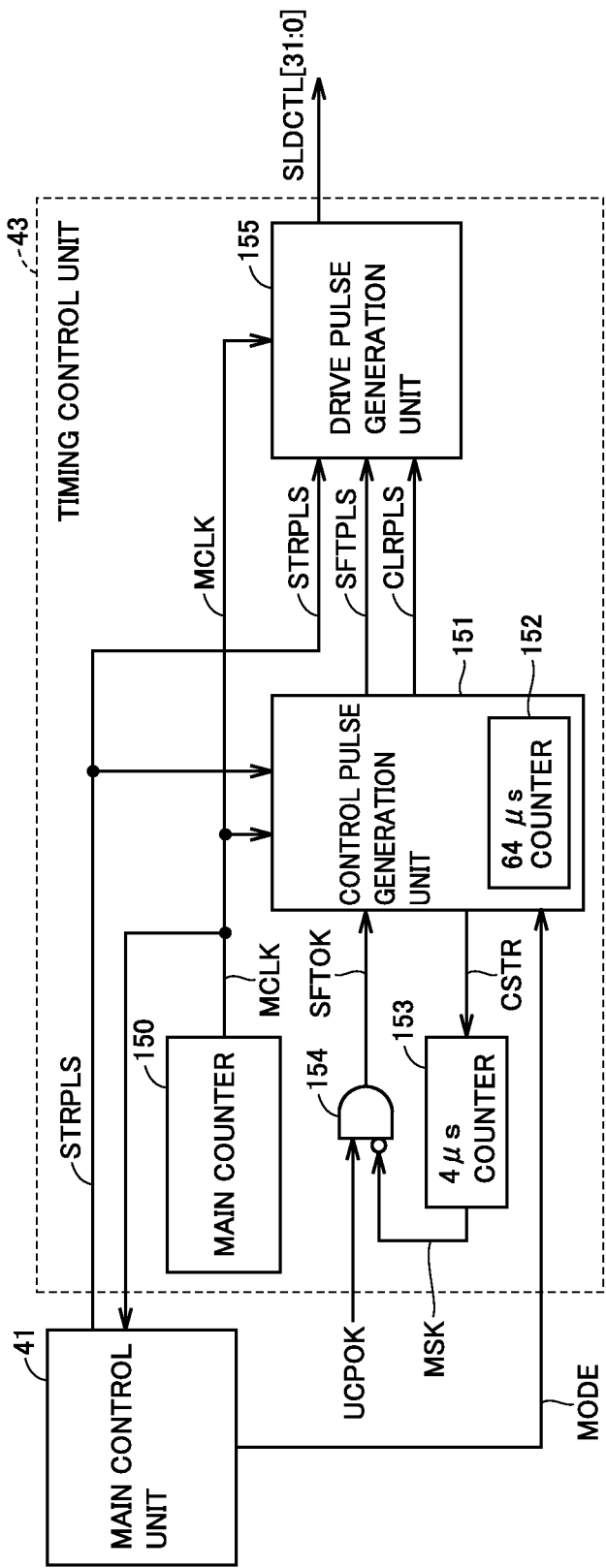
FIG. 17 is a block diagram showing a configuration of a timing control unit in FIG. 12.

FIG. 17 is a block diagram showing a configuration of the timing control unit in FIG. 12. Referring to FIG. 17, timing control unit 43 includes a main counter 150, a control pulse generation unit 151 generating control pulse signals (shift pulse SFTPLS, clear pulse CLRPLS), a drive pulse generation unit 155 generating control signal SLDCTL [31:0] for driving source line driver SLD, a counter 153, and an AND gate 154.

Main counter 150 generates master clock MCLK serving as a reference of the operation of each element.

Control pulse generation unit 151 outputs a control pulse signal (shift pulse SFTPLS, clear pulse CLRPLS) to drive pulse generation unit 155 in response to start pulse signal STRPLS which is output from main control unit 41. Drive pulse generation unit 155 outputs control signals SLDCTL0 to SLDCTL31 to source line drivers SLD0 to SLD31, respectively, in response to the control pulse signal (shift pulse SFTPLS, clear pulse CLRPLS).

Counter 153 is provided for measuring, in the first and second erase modes, mask period Tmsk described above in connection with FIG. 8. In the case of the third embodiment, mask period Tmsk is set to approximately 4 μs by way of example. When control pulse generation unit 151 outputs shift pulse SFTPLS, control pulse generation unit 151 causes start signal CSTR, which is used for causing counter 153 to start counting, to become the active state (H level in the case of the third embodiment). Counter 153 keeps mask signal MSK in the active state (H level in the case of the third embodiment) until mask period Tmsk (4 μs) has elapsed since activation of start signal CSTR. AND gate 154 performs an AND operation on control signal UCPOK which is output from voltage detection unit 53 in FIG. 12 and a signal generated by inverting the logical level of mask signal MSK, and outputs the result of the operation as control signal SFTOK to control pulse generation unit 151. Thus, when mask period Tmsk (4 μs) has elapsed since output of shift pulse SFTPLS and control signal UCPOK becomes the active state (H level), control signal SFTOK becomes the active state (H level in the case of the third embodiment). After control pulse generation unit 151 outputs shift pulse SFTPLS, it outputs the subsequent shift pulse SFTPLS in response to the fact that control signal SFTOK becomes the active state (H level).

A counter 152 incorporated in control pulse generation unit 151 is provided for measuring, in the second erase mode, erase-pulse application time Tp described above in connection with FIG. 11. In the case of the third embodiment, application time Tp is set to approximately 64 μs by way of example. In the second erase mode, control pulse generation unit 151 outputs clear pulse CLRPLS when application time Tp (64 μs) has elapsed since output of shift pulse SFTPLS.

Figure 18:
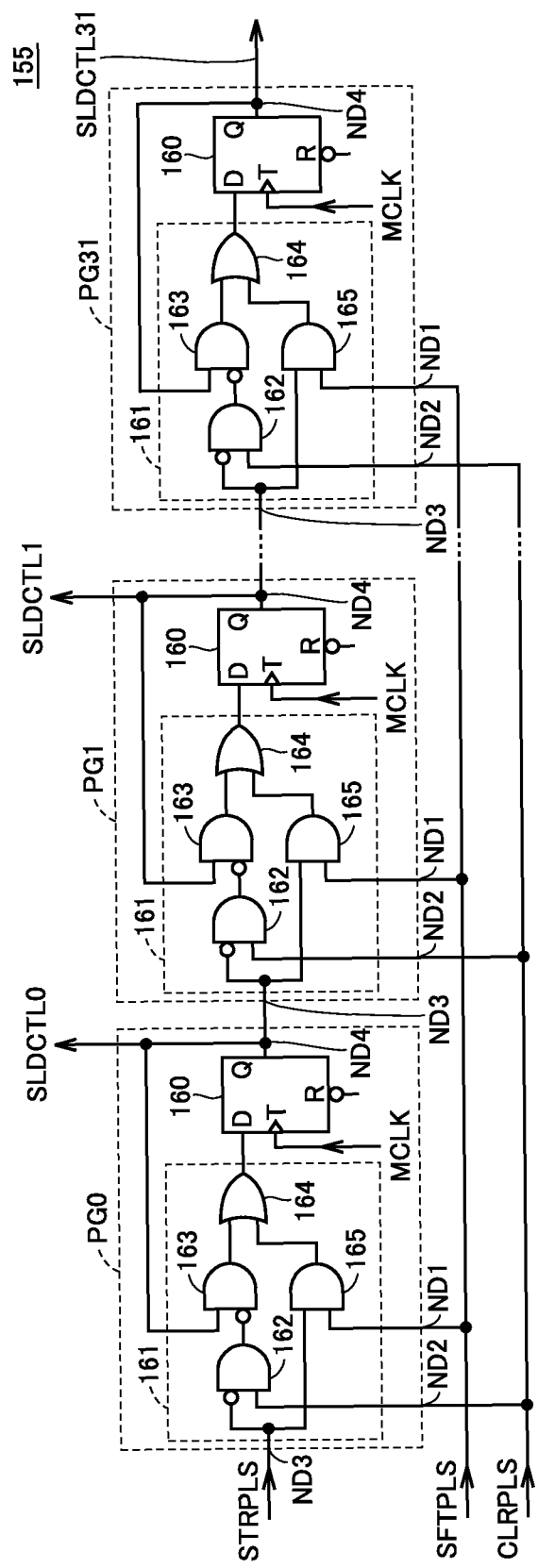
FIG. 18 is a circuit diagram showing a configuration of a drive pulse generation unit in FIG. 17.

FIG. 18 is a circuit diagram showing a configuration of the drive pulse generation unit in FIG. 17. Referring to FIG. 17, drive pulse generation unit 155 includes 32 pulse generators PG0 to PG31 corresponding to source line drivers SLD0 to SLD31, respectively. Pulse generators PG0 to PG31 generate control signals SLDCTL0 to SLDCTL31 respectively and output them to respective corresponding source line drivers.

Pulse generators PG0 to PG31 have the same configurations. Each pulse generator PG includes a D flip-flop 160, a logic circuit unit 161, input nodes ND1 to ND3, and an output node ND4. To input node ND1, common shift pulse SFTPLS is input. To input node ND2, common clear pulse CLRPLS is input. From output nodes ND4 of pulse generators PG0 to PG31, control signals SLDCTL0 to SLDCTL31 are output, respectively. To input node ND3 of the first pulse generator PG0, start pulse signal STRPLS is input. To input node ND3 of the (i+1)-th (1≤i≤31) pulse generator PGi, control signal SLDCTLi−1 which is output from output node ND4 of the i-th pulse generator PGi−1 is input. To a clock terminal T of each D flip-flop 160, master clock MCLK is input.

In the case of the third embodiment, an output terminal Q of the D flip-flop in each of pulse generators PG0 to PG31 is connected to output node ND4. Thus, in the case where D flip-flop 160 is the set state, control signal SLDCTL which is output from output node ND4 is the active state (H level). When D flip-flop 160 is the reset state, control signal SLDCTL which is output from output node ND4 is the inactive state (L level).

In each of pulse generators PG0 to PG31, logic circuit unit 161 receives shift pulse SFTPLS, clear pulse CLRPLS, a signal (start pulse signal STRPLS or control signal SLDCTL which is output from pulse generator PG in the preceding stage) which is input to input node ND3, and control signal SLDCTL (output signal of flip-flop 160) which is output from output node ND4. In the case where logic circuit unit 161 receives shift pulse SFTPLS when D flip-flop 160 is the reset state and the signal which is input to input node ND3 is the active state (H level), logic circuit unit 161 switches D flip-flop 160 from the reset state to the set state. In the case where logic circuit unit 161 receives clear pulse CLRPLS when D flip-flop 160 is the set state and the signal which is input to input node ND3 is the inactive state (L level), logic circuit unit 161 switches D flip-flop 160 from the set state to the reset state.

More specifically, logic circuit unit 161 includes AND gates 162, 163, 165 and an OR gate 164. AND gate 162 performs an AND operation on clear pulse CLRPLS and an inverted signal generated by inverting the logic level of the signal which is input to input node ND3, and outputs the result of the operation. AND gate 163 performs an AND operation on the output signal of D flip-flop 160 and an inverted signal generated by inverting the logic level of the output signal of AND gate 162, and outputs the result of the operation. AND gate 165 performs an AND operation on shift pulse SFTPLS and the signal which is input to input node ND3, and outputs the result of the operation. OR gate 164 performs an OR operation on the output signal of AND gate 163 and the output signal of AND gate 165, and outputs the result of the operation to input terminal D of D flip-flop 160.

[Operation of Drive Pulse Generation Unit]

Figure 19:
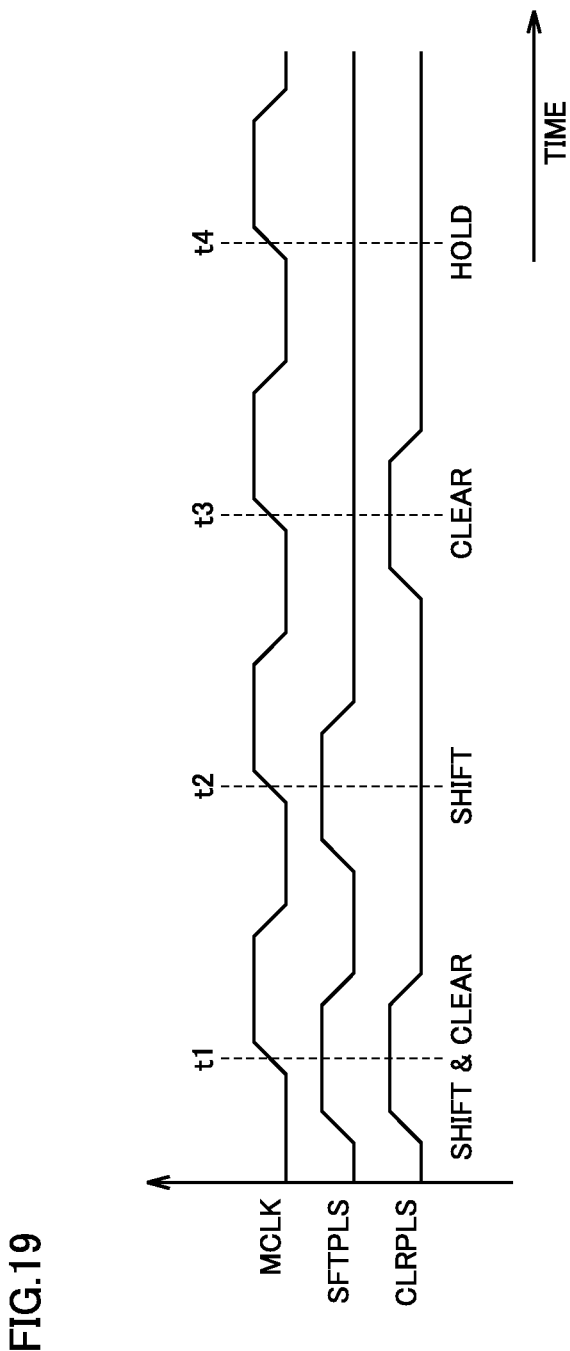
FIG. 19 is a diagram for illustrating an operation of the drive pulse generation unit in FIG. 18.

FIG. 19 is a diagram for illustrating an operation of the drive pulse generation unit in FIG. 18. Referring to FIGS. 18 and 19, drive pulse generation unit 155 performs four operations, namely a shift & clear operation, a shift operation, a clear operation, and a hold operation.

The shift & clear operation (time t1 in FIG. 19) is performed when both shift pulse SFTPLS and clear pulse CLRPLS are applied to drive pulse generation unit 155. In the shift & clear operation, control signal SLDCTL to which assigned a number subsequent to the number assigned to currently active control signal SLDCTL is activated and currently active control signal SLDCTL is deactivated.

The shift operation (time t2 in FIG. 19) is performed when only shift pulse SFTPLS is applied to drive pulse generation unit 155. In the shift operation, a control signal, which is subsequent to the control signal to which assigned the maximum number among control signals SLDCTL in the active state, becomes the active state.

The clear operation (t3 in FIG. 19) is performed when only clear pulse CLRPLS is applied to drive pulse generation unit 155. In the clear operation, a control signal to which the smallest number is assigned among control signals SLDCTL in the active state becomes the inactive state.

In the hold operation (time t4 in FIG. 19), none of shift pulse SFTPLS and clear pulse CLRPLS is applied to drive pulse generation unit 155, and the logic level of each control signal SLDCTL remains unchanged.

Figure 20:
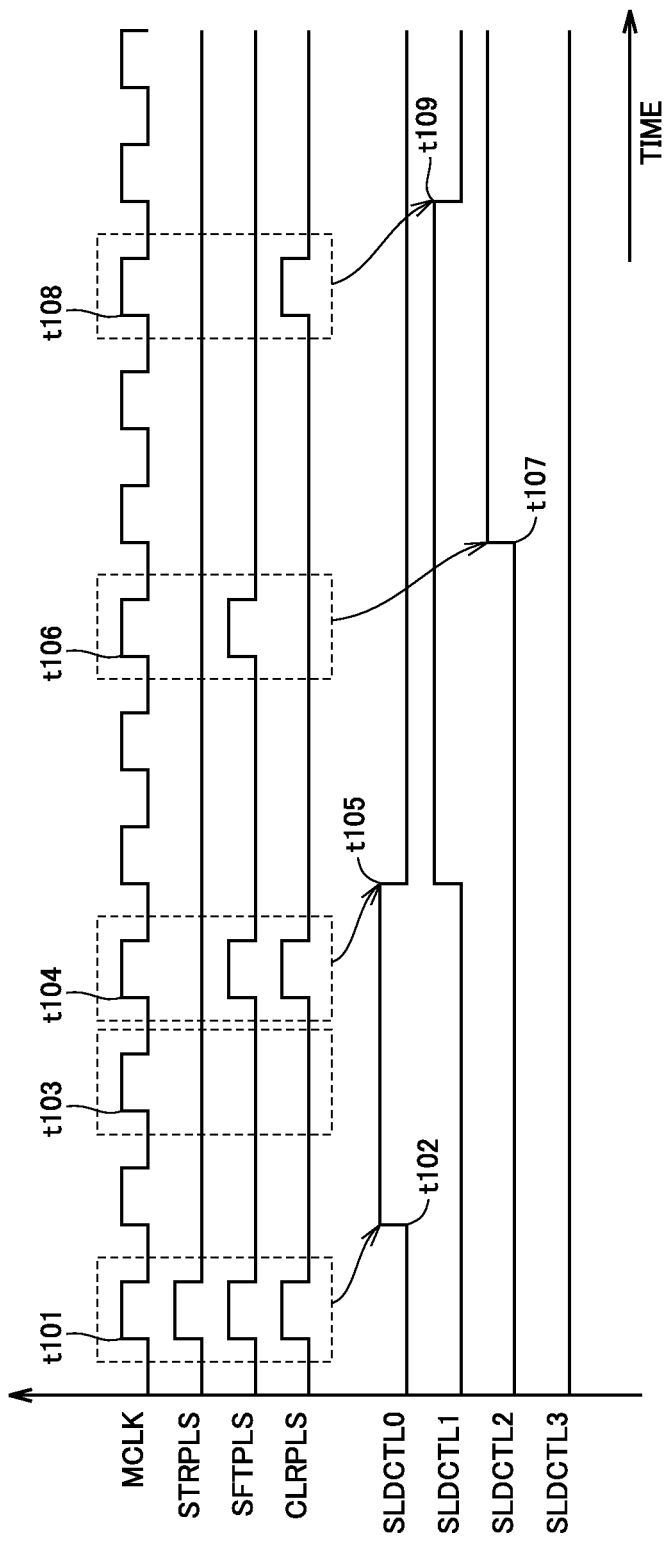
FIG. 20 is a timing diagram showing an example operation of the drive pulse generation unit in FIG. 18.

FIG. 20 is a timing diagram showing an example operation of the drive pulse generation unit in FIG. 18. Referring to FIGS. 18 and 20, all control signals SLDCTL0 to SLDCTL31 are the inactive state before the initial time t101.

At time t101, start pulse signal STRPLS becomes the active state (H level) and both shift pulse SFTPLS and clear pulse CLRPLS are applied to drive pulse generation unit 155. Consequently, at the subsequent rising edge (t102) of master clock MCLK, control signal SLDCTL0 becomes the active state (H level) (shift & clear operation).

At subsequent time t103, none of shift pulse SFTPLS and clear pulse CLRPLS is applied to drive pulse generation unit 155. Accordingly, at the subsequent rising edge (time t104) of master clock MCLK, the logic level of each control signal SLDCTL remains unchanged (hold operation).

At subsequent time t104, both shift pulse SFTPLS and clear pulse CLRPLS are applied to drive pulse generation unit 155. Consequently, at the subsequent rising edge (time t105) of master clock MCLK, control signal SLDCTL0 returns to the inactive state (L level) and subsequent control signal SLDCTL1 becomes the active state (H level) (shift & clear operation).

At subsequent time t106, only shift pulse SFTPLS is applied to drive pulse generation unit 155. Consequently, at the subsequent rising edge (time t107) of master clock MCLK, control signal SLDCTL2 becomes the active state (H level) (shift operation). The active state of control signal SLDCTL1 is maintained.

At subsequent time t108, only clear pulse CLRPLS is applied to drive pulse generation unit 155. Consequently, at the subsequent rising edge (time t109) of master clock MCLK, control signal SLDCTL1 becomes the inactive state (L level) (clear operation). The active state of control signal SLDCTL2 is maintained.

[Erase Operation of Nonvolatile Memory Device in First Erase Mode]

Figure 21:
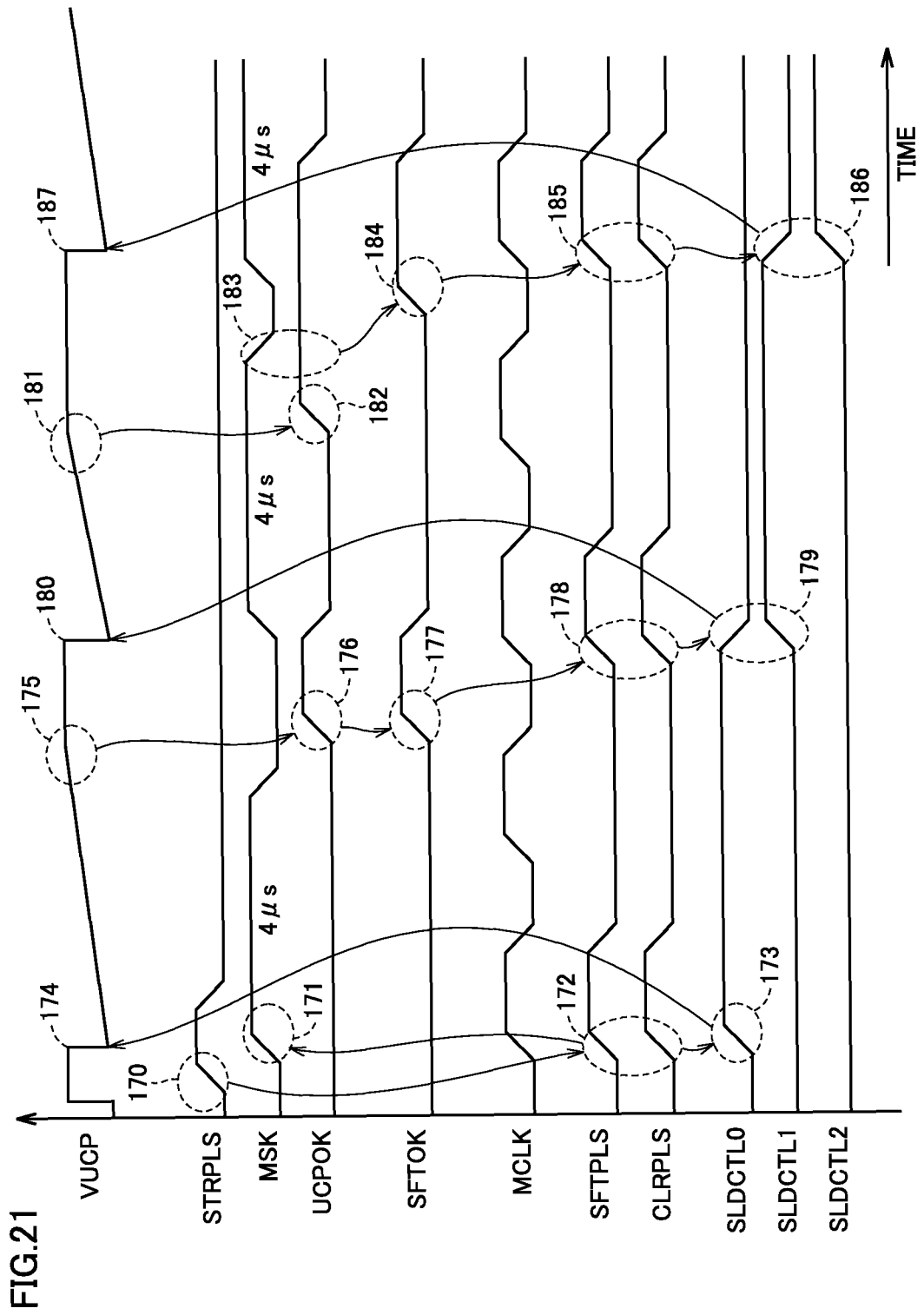
FIG. 21 is a diagram for illustrating an erase operation of a nonvolatile memory device in a first erase mode.

FIG. 21 is a diagram for illustrating the erase operation of the nonvolatile memory device in the first erase mode. In the first erase mode, control pulse generation unit 151 outputs clear pulse CLRPLS together with shift pulse SFTPLS.

Referring to FIGS. 17, 18, and 21, when start pulse signal STRPLS becomes the active state (H level) (170), control pulse generation unit 151 outputs shift pulse SFTPLS and clear pulse CLRPLS (172) and causes counter 153 to start counting (171). In response to start pulse signal STRPLS, shift pulse SFTPLS, and clear pulse CLRPLS that are the H level, drive pulse generation unit 155 switches control signal SLDCTL0 which is output to source line driver SLD0 to the active state (H level) (173). Consequently, output voltage VUCP of charge pump circuit 52 in FIG. 12 temporarily decreases (174).

When output voltage VUCP of charge pump circuit 52 recovers to a target voltage (175), control signal UCPOK which is output from voltage detection unit 53 in FIG. 12 switches to the active state (H level) (176). At this time, mask signal MSK has returned to the L level and therefore control signal SFTOK which is output from AND gate 154 switches to the H level (177).

In response to control signal SFTOK of the H level, control pulse generation unit 151 outputs shift pulse SFTPLS and clear pulse CLRPLS (178) at the timing of the subsequent rising of master clock MCLK, and causes counter 153 to start counting. In response to shift pulse SFTPLS and clear pulse CLRPLS, drive pulse generation unit 155 switches control signal SLDCTL0 which is output to source line driver SLD0 to the inactive state (L level) and switches control signal SLDCTL1 which is output to source line driver SLD1 to the active state (H level) (179). Consequently, output voltage VUCP of charge pump circuit 52 in FIG. 12 temporarily decreases (180).

When output voltage VUCP of charge pump circuit 52 recovers to a target voltage (181), control signal UCPOK which is output from voltage detection unit 53 in FIG. 12 switches to the active state (H level) (182). It should be noted that mask signal MSK has not returned to the L level at this time.

When mask signal MSK returns to the L level (183), control signal SFTOK which is output from AND gate 154 switches to the H level (184). In response to control signal SFTOK of the H level, control pulse generation unit 151 outputs shift pulse SFTPLS and clear pulse CLRPLS (185) at the timing of the subsequent rising of master clock MCLK, and causes counter 153 to start counting. In response to shift pulse SFTPLS and clear pulse CLRPLS, drive pulse generation unit 155 switches control signal SLDCTL1 which is output to source line driver SLD1 to the inactive state (L level) and switches control signal SLDCTL2 which is output to source line driver SLD2 to the active state (H level) (186). Consequently, output voltage VUCP of charge pump circuit 52 in FIG. 12 temporarily decreases (187). After this, a control operation similar to the above-described one is repeated.

[Erase Operation of Nonvolatile Memory Device in Second Erase Mode]

Figure 22:
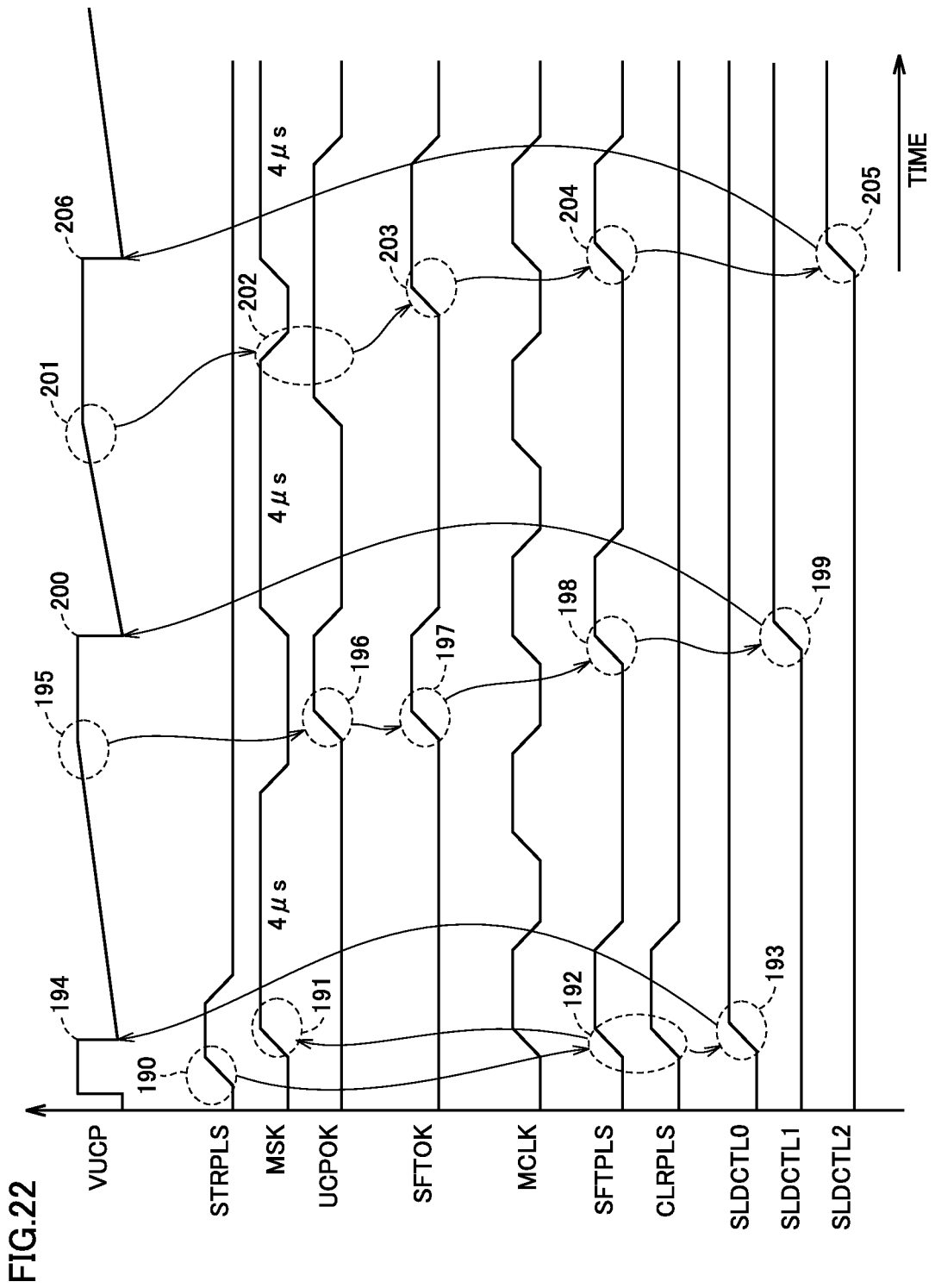
FIG. 22 is a diagram for illustrating an erase operation of a nonvolatile memory device in a second erase mode.

FIG. 22 is a diagram for illustrating the erase operation of the nonvolatile memory device in the second erase mode. In the second erase mode, control pulse generation unit 151 outputs clear pulse CLRPLS when a predetermined application time Tp (64 µs) has elapsed since output of shift pulse SFTPLS.

Referring to FIGS. 17, 18, and 22, when start pulse signal STRPLS becomes the active state (H level) (190), control pulse generation unit 151 outputs shift pulse SFTPLS and clear pulse CLRPLS (192) and causes counter 153 to start counting (191). In response to start pulse signal STRPLS, shift pulse SFTPLS, and clear pulse CLRPLS that are the H level, drive pulse generation unit 155 switches control signal SLDCTL0 which is output to source line driver SLD0 to the active state (H level) (193). Consequently, output voltage VUCP of charge pump circuit 52 in FIG. 12 temporarily decreases (194).

When output voltage VUCP of charge pump circuit 52 recovers to a target voltage (195), control signal UCPOK which is output from voltage detection unit 53 in FIG. 12 switches to the active state (H level) (196). At this time, mask signal MSK has returned to the L level and therefore control signal SFTOK which is output from AND gate 154 switches to the H level (197).

In response to control signal SFTOK of the H level, control pulse generation unit 151 outputs only shift pulse SFTPLS (198) at the timing of the subsequent rising of master clock MCLK, and causes counter 153 to start counting. In response to shift pulse SFTPLS, drive pulse generation unit 155 switches control signal SLDCTL1 which is output to source line driver SLD1 to the active state (H level) (199). Consequently, output voltage VUCP of charge pump circuit 52 in FIG. 12 temporarily decreases (200). At this time, control signal SLDCTL0 is still maintained in the active state (H level).

When output voltage VUCP of charge pump circuit 52 recovers to a target voltage (201), control signal UCPOK which is output from voltage detection unit 53 in FIG. 12 switches to the active state (H level). It should be noted that mask signal MSK has not returned to the L level at this time.

When mask signal MSK returns to the L level (202), control signal SFTOK which is output from AND gate 154 switches to the H level (203). In response to control signal SFTOK of the H level, control pulse generation unit 151 outputs shift pulse SFTPLS (204) at the timing of the subsequent rising of master clock MCLK, and causes counter 153 to start counting. In response to shift pulse SFTPLS, drive pulse generation unit 155 switches control signal SLDCTL2 which is output to source line driver SLD2 to the active state (H level) (205). Consequently, output voltage VUCP of charge pump circuit 52 in FIG. 12 temporarily decreases (206). At this time, control signals SLDCTL0, SLDCTL1 are still maintained in the active state (H level).

Control pulse generation unit 151 outputs clear pulse CLRPLS when application time Tp (64 µs) measured by counter 152 has elapsed since output of the first shift pulse SFTPLS (192). Accordingly, control signal SLDCTL0 switches to the L level. Control pulse generation unit 151 outputs clear pulse CLRPLS when application time Tp (64 µs) measured by counter 152 has elapsed since output of the second shift pulse SFTPLS (198). Accordingly, control signal SLDCTL1 switches to the L level. Control pulse generation unit 151 outputs clear pulse CLRPLS when application time Tp (64 µs) measured by counter 152 has elapsed since output of the third shift pulse SFTPLS (204). Accordingly, control signal SLDCTL2 switches to the L level. After this, an operation similar to the above-described one is repeated.

Fourth Embodiment

In the first to third embodiments, the output voltage of the charge pump circuit is monitored and application of the erase pulse is ended in response to the fact that the output voltage of the charge pump circuit recovers to a target voltage (the output voltage becomes equal to or more than a reference value). As described above in connection with FIGS. 7 and 8, the recovery of the output voltage of the charge pump circuit reflects decrease of the erase current. The erase current, however, is not accurately measured.

In a fourth embodiment, the output current (erase current) of the charge pump circuit is directly monitored and application of the erase pulse is ended in response to the fact that the output current becomes equal to or less than a reference value. Accordingly, the erase-pulse application time can more appropriately be set as compared with the first to third embodiments. In the following, a specific description will be given with reference to FIG. 23.

Figure 23:
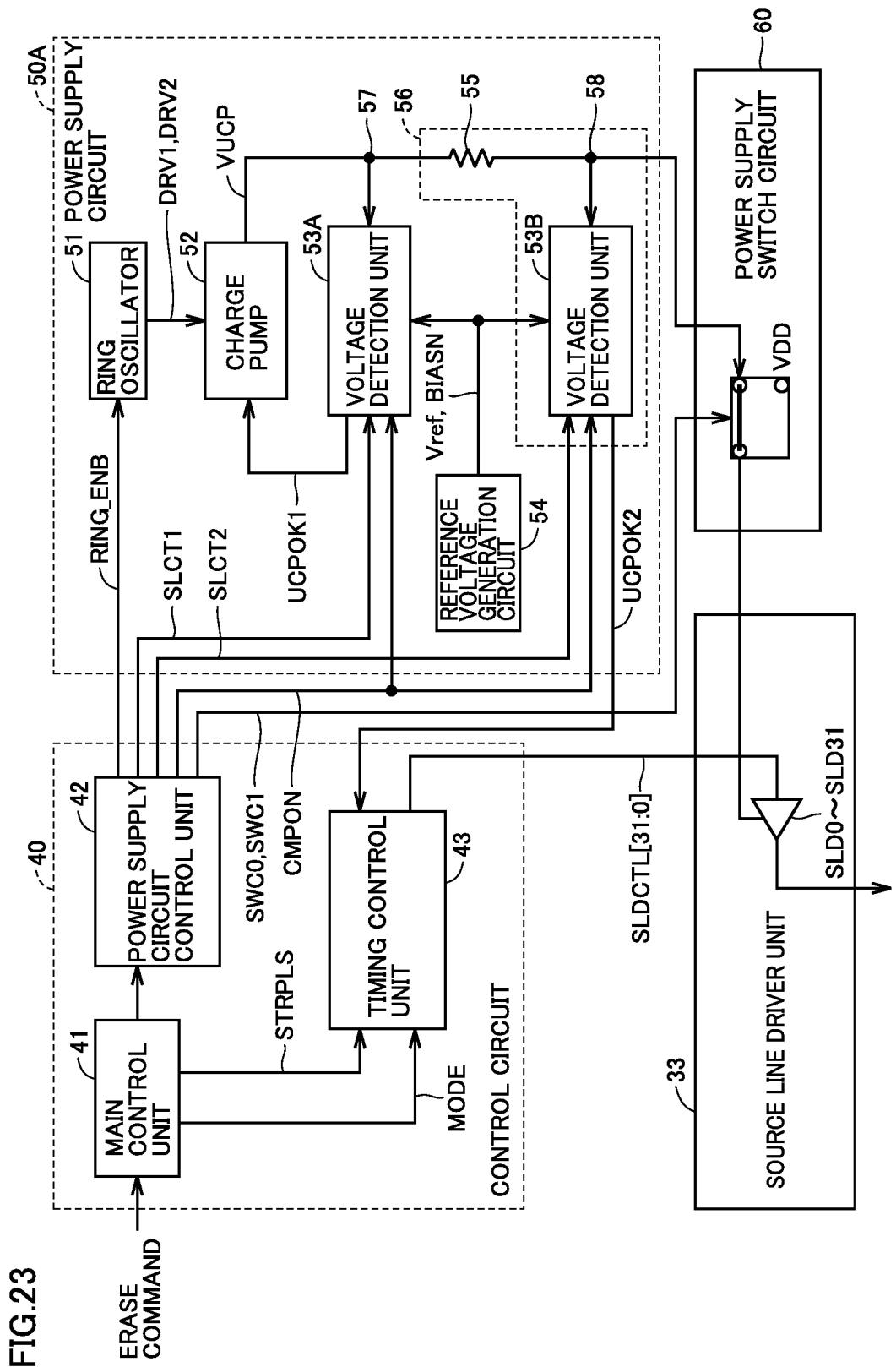
FIG. 23 is a diagram showing a configuration of a power supply circuit of a nonvolatile memory device in a semiconductor device of a fourth embodiment.

FIG. 23 is a diagram showing a configuration of a power supply circuit of a nonvolatile memory device in a semiconductor device of the fourth embodiment. Power supply circuit 50A in FIG. 23 differs from power supply circuit 50 in FIG. 12 in that the former further includes an additional voltage detection unit 53B and a resistive element 55.

The configuration of voltage detection unit 53A in FIG. 23 is identical to the configuration of voltage detection unit 53 described above in connection with FIGS. 12 and 15. Voltage detection unit 53A compares a voltage generated by voltage division of output voltage VUCP of charge pump circuit 52 at a voltage division ratio based on select signal SLCT1, with reference voltage Vref. When the voltage generated by voltage division becomes equal to or more than reference voltage Vref, voltage detection unit 53A switches control signal UCPOK1 to the active state (H level). When control signal UCPOK1 becomes the active state (H level), charge pump circuit 52 stops the boosting operation. Under this feedback control, charge pump circuit 52 operates to maintain its output voltage VUCP at a target voltage based on select signal SLCT1.

Resistive element 55 is inserted in a passage extending from charge pump circuit 52 to power supply switch circuit 60 along which boosted voltage VUCP is supplied. Namely, one end 57 of resistive element 55 is connected to the output node of charge pump circuit 52.

The configuration of voltage detection unit 53B in FIG. 23 is identical to the configuration of voltage detection unit 53 described above in connection with FIGS. 12 and 15. Voltage detection unit 53B compares a voltage generated by voltage division of the voltage of the other end 58 of resistive element 55 at a voltage division ratio based on select signal SLCT2, with reference voltage Vref. When the voltage generated by voltage division becomes equal to or more than reference voltage Vref, voltage detection unit 53B switches control signal UCPOK2 to the active state (H level). Control signal UCPOK2 is output to timing control unit 43. Timing control unit 43 outputs the next shift pulse SFTPLS when control signal UCPOK2 becomes the active state (H level) and predetermined mask period Tmsk has elapsed since output of the immediately preceding shift pulse SFTPLS.

The above-described resistive element 55 and voltage detection unit 53B constitute a current detection circuit 56. Current detection circuit 56 detects a voltage drop of resistive element 55 (namely the output current of charge pump circuit 52). Based on the result of the detection of current detection circuit 56, timing control unit 43 controls the timing at which shift pulse SFTPLS is output. In order to more accurately monitor the output current of charge pump circuit 52, it is more desirable to detect a potential difference across the two ends of resistive element 55.

Other features of the configuration of nonvolatile memory device 4 are identical to those described above in connection with the first to third embodiments, and therefore, the description thereof will not be repeated.

In the semiconductor device of the fourth embodiment, current detection circuit 56 is constituted of voltage detection unit 53B and resistive element 55. Apparently, current detection circuit 56 can also have a configuration in which resistive element 55 is not provided and only voltage detection unit 53B is simply added so that there are provided voltage detection unit 53A for controlling activation and deactivation of charge pump circuit 52 and voltage detection unit 53B for controlling timing control unit 43.

While the invention made by the inventors of the present invention has specifically been described based on the embodiments, apparently the present invention is not limited to the above-described embodiments and can be modified in a variety of ways within the essential scope of the invention.

REFERENCE SIGNS LIST 1 microcomputer chip (semiconductor device); 4 nonvolatile memory device; 20 silicon substrate; 21 control gate; 22 silicon nitride film (charge storage portion); 23 memory gate; 24 source region; 25 drain region; 30 memory array; 40 control circuit; 41 main control unit; 42 power supply circuit control unit; 43 timing control unit; 50, 50A power supply circuit; 51 ring oscillator; 52 charge pump circuit; 53, 53A, 53B voltage detection unit; 54 reference voltage generation circuit; 55 resistive element; 56 current detection circuit; 60 power supply switch circuit; ND1, ND2, ND3 input node; ND4 output node; 150 main counter; 151 control pulse generation unit; 152, 153 counter; 155 drive pulse generation unit; 160 flip-flop; 161 logic circuit unit; BL main bit line; SBL sub bit line; SLD0-SLD31 source line driver; SLDCTL0-SLDCTL31 control signal; CGL control gate line; CLRPLS clear pulse; MB0-MB31 memory block; MC memory cell; MGL memory gate line; MODE mode set signal; PG0-PG31 pulse generator; SFTPLS shift pulse; SL source line; STRPLS start pulse signal; Tmsk mask period; Tp application time; VUCP boosted voltage; Vref reference voltage

The invention claimed is:
1. A semiconductor device comprising:
a memory cell transistor having a charge storage portion and storing data based on a change of a threshold voltage depending on an amount of charge in said charge storage portion;
a voltage generation unit generating a boosted voltage to be supplied to one main electrode of said memory cell transistor in an erase operation based on a band-to-band tunneling scheme;
a detection unit detecting an output voltage of said voltage generation unit and comparing the output voltage with a reference value; and
a control unit controlling a timing at which said boosted voltage is supplied in said erase operation,
said control unit ending supply of said boosted voltage when a predetermined first reference time has elapsed since start of supply of said boosted voltage and a result of detection and comparison by said detection unit indicates that said boosted voltage has become equal to or more than said reference value.
2. The semiconductor device according to claim 1, wherein said voltage generation unit includes a charge pump circuit.
3. A semiconductor device comprising:
a plurality of memory cell transistors each having a charge storage portion and storing data based on a change of a threshold voltage depending on an amount of charge in said charge storage portion,
said plurality of memory cell transistors being divided into n groups, transistors belonging to the same group each having one main electrode connected to a common line;

a voltage generation unit generating a boosted voltage to be supplied to said common line of each said group in an erase operation based on a band-to-band tunneling scheme;

a detection unit detecting an output voltage of said voltage generation unit and comparing the output voltage with a reference value; and a control unit controlling a timing at which said boosted voltage is supplied in said erase operation, said control unit starting supply of said boosted voltage to an (i+1)-th group ($1 \leq i \leq n-1$) when a predetermined first reference time has elapsed since start of supply of said boosted voltage to an i-th group and a result of detection and comparison by said detection unit indicates that said boosted voltage has become equal to or more than said reference value.

4. The semiconductor device according to claim 3, wherein said control unit ends supply of said boosted voltage to the i-th group ($1 \leq i \leq n-1$) when supply of said boosted voltage to the (i+1)-th group is started.

5. The semiconductor device according to claim 3, wherein said control unit ends supply of said boosted voltage to a j-th group ($1 \leq j \leq n$) when a predetermined second reference time longer than said first reference time has elapsed since start of supply of said boosted voltage to the j-th group.

6. The semiconductor device according to claim 3, further comprising n drivers corresponding respectively to said n groups and each supplying said boosted voltage to a corresponding group when a control signal supplied to each driver is an active state, wherein said control unit includes n control signal generation units corresponding respectively to said n drivers and each generating said control signal to be output to a corresponding driver, and said n control signal generation units each include a flip-flop, said control signal which is output to a corresponding driver is activated when said flip-flop is a first state and said control signal which is output to a corresponding driver is deactivated when said flip-flop is a second state.

7. The semiconductor device according to claim 6, wherein said n control signal generation units each include:

a first input node to which a common first control pulse is input;

a second input node to which a common second control pulse is input;

a third input node; and an output node from which said control signal is output, a start signal is input to said third input node of a first control signal generation unit, said control signal which is output from a k-th ($1 \leq k \leq n-1$) control signal generation unit is input to said third input node of a (k+1)-th control signal generation unit, said n control signal generation units each switch said flip-flop from said second state to said first state upon receiving said first control pulse when said flip-flop is said second state and the signal which is input to said third input node is an active state, and said n control signal generation units each switch said flip-flop from said first state to said second state upon receiving said second control pulse when said flip-flop is said first state and the signal which is input to said third input node is an inactive state.

8. The semiconductor device according to claim 7, wherein said control unit further includes a control pulse generation unit generating said first and second control pulses, said control pulse generation unit outputs said second control pulse together with said first control pulse in a first erase mode, and said control pulse generation unit outputs said second control pulse when a predetermined second reference time longer than said first reference time has elapsed since output of said first control pulse in a second erase mode.

9. The semiconductor device according to claim 3, wherein said voltage generation unit includes a charge pump circuit.

10. A semiconductor device comprising:

a plurality of memory cell transistors each having a charge storage portion and storing data based on a change of a threshold voltage depending on an amount of charge in said charge storage portion, said plurality of memory cell transistors being divided into n groups, transistors belonging to the same group each having one main electrode connected to a common line;

a voltage generation unit generating a boosted voltage to be supplied to said common line of each said group in an erase operation based on a band-to-band tunneling scheme;

a detection unit detecting an output current of said voltage generation unit and comparing the output current with a reference value; and a control unit controlling a timing at which said boosted voltage is supplied in said erase operation, said control unit starting supply of said boosted voltage to an (i+1)-th group ($1 \leq i \leq n-1$) when a predetermined first reference time has elapsed since start of supply of said boosted voltage to an i-th group and a result of detection and comparison by said detection unit indicates that said output current has become equal to or less than said reference value.

* * * * *